(12) United States Patent
Habu et al.

(10) Patent No.: US 6,198,122 B1
(45) Date of Patent: Mar. 6, 2001

(54) SEMICONDUCTOR MEMORY AND METHOD OF FABRICATING THE SAME

(75) Inventors: Mariko Habu, Yokohama; Yusuke Kohyama, Yokosuka; Toru Ozaki, Tokyo; Keiji Hosotani, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/025,908

(22) Filed: Feb. 19, 1998

(30) Foreign Application Priority Data

Feb. 21, 1997 (JP) ..................................... 9-037421

(51) Int. Cl.⁷ ........................ H01L 27/108; H01L 29/76; H01L 29/94; H01L 31/119
(52) U.S. Cl. ............................ 257/296; 257/303; 257/306
(58) Field of Search ..................... 257/296, 306, 257/303, 304, 307; 438/622, 253, 396

(56) References Cited

U.S. PATENT DOCUMENTS 5,828,097 * 10/1998 Tanigawa ............................ 257/306
5,907,788 * 5/1999 Kasai ................................... 438/622

* cited by examiner

Primary Examiner—Steven Loke
Assistant Examiner—Thien F. Tran
(74) Attorney, Agent, or Firm—Hogan & Hartson, LLP.

(57) ABSTRACT

A semiconductor memory includes a semiconductor substrate, a memory cell portion formed on the substrate and including stacked capacitors formed on the substrate, each having a storage electrode formed on a bottom surface of a recess in an insulating layer, a capacitor insulating film formed on the storage electrode, and a plate electrode formed on the capacitor insulating film and lower than an upper edge of the recess, and a first multilayered interconnecting layer having an interconnecting layer including a plate interconnection connected to the plate electrode, and a peripheral circuit portion formed adjacent to the memory cell portion on the substrate and comprising a second multilayered interconnecting layer. The plate interconnection includes a portion so formed as to bury the recess and connected to the plate electrode, and the second multilayered interconnecting layer includes an interconnecting layer having an upper surface substantially leveled with an upper surface of the interconnecting layer including the plate interconnection of the first multilayered interconnecting layer.

13 Claims, 22 Drawing Sheets

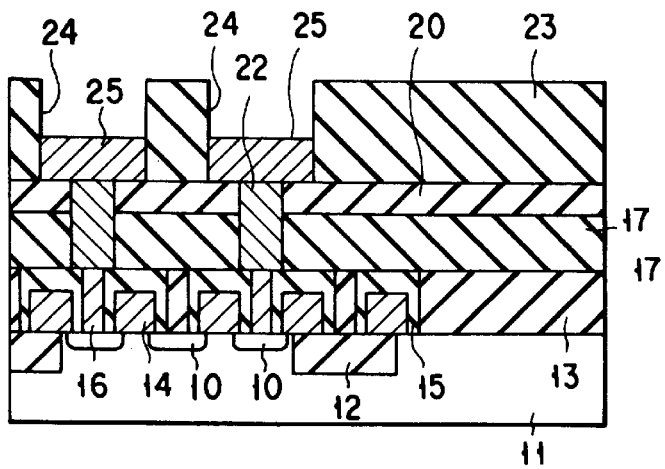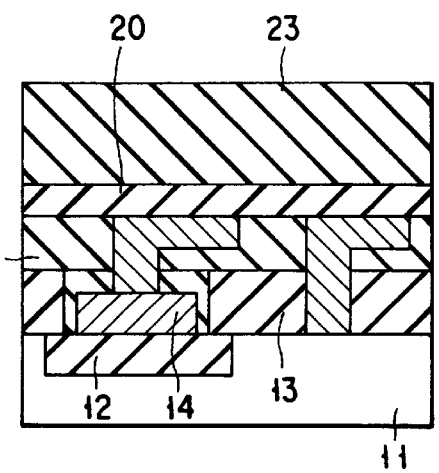
FIG. 6A  FIG. 6B
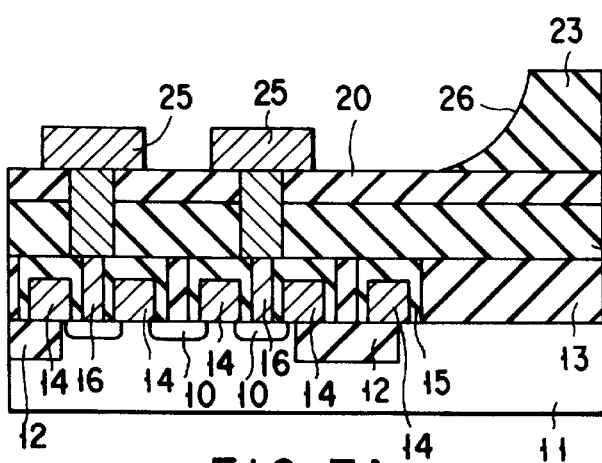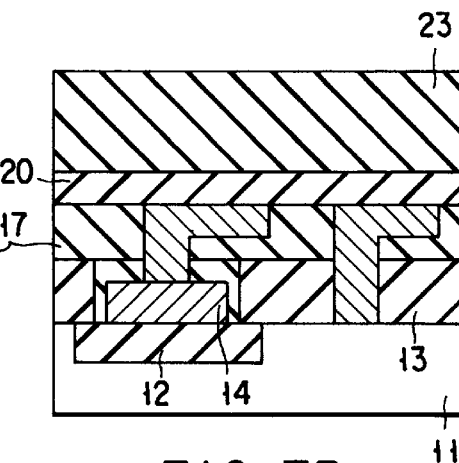
FIG. 7A  FIG. 7B
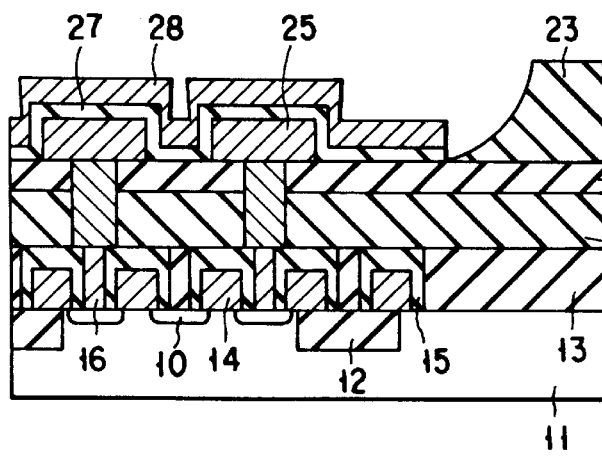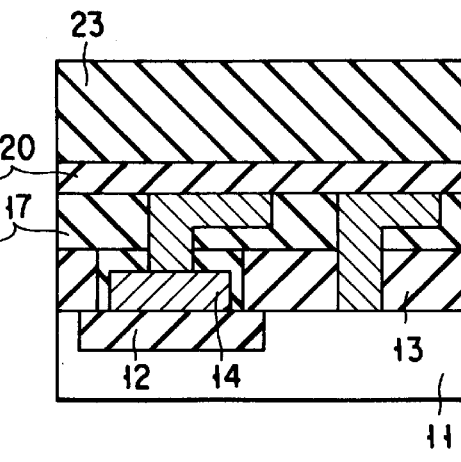
FIG. 8A  FIG. 8B

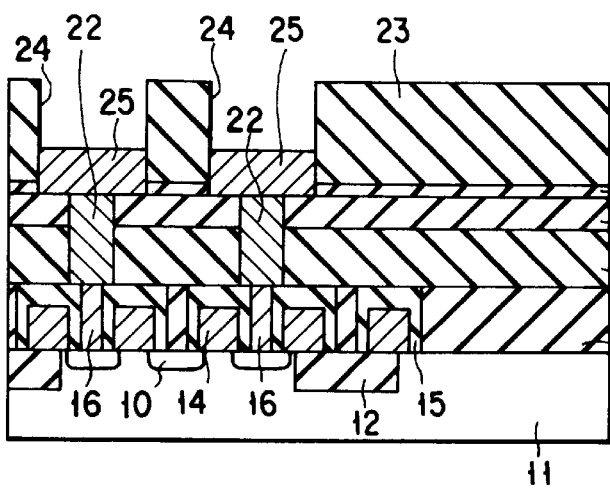
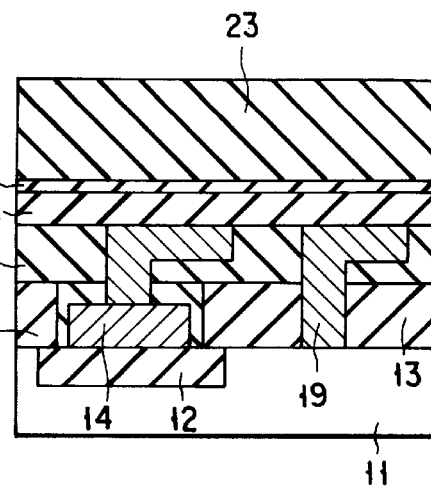
FIG. 12A  FIG. 12B
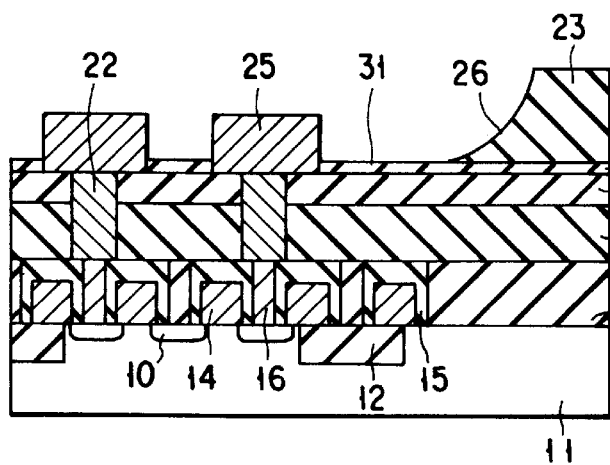
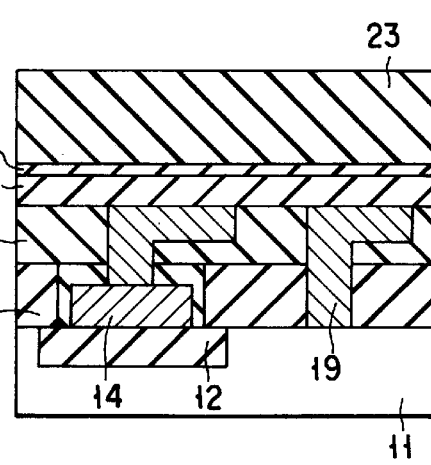
FIG. 13A  FIG. 13B
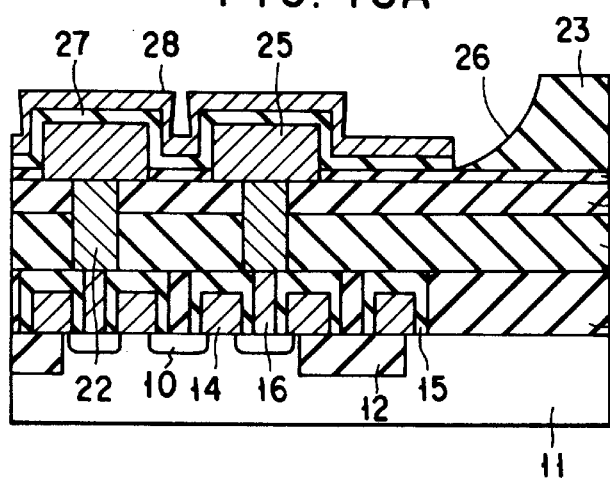
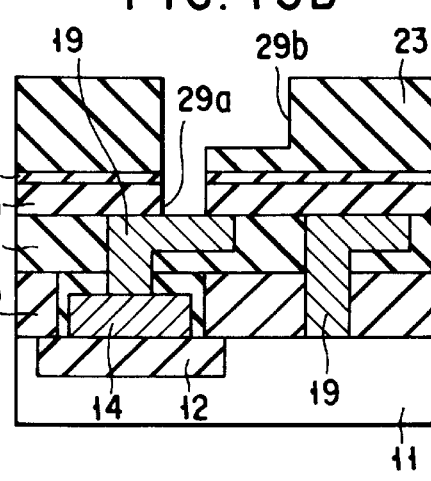
FIG. 14A  FIG. 14B

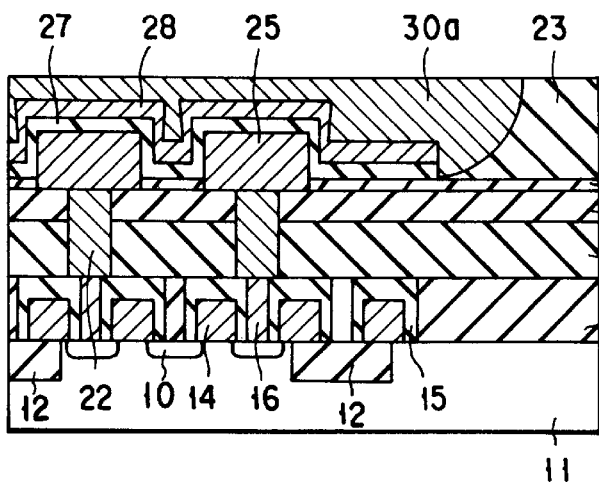 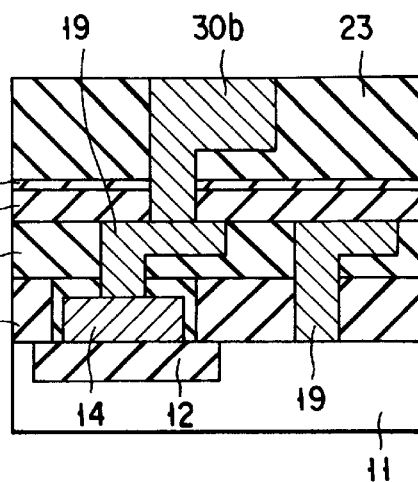
FIG. 15A  FIG. 15B
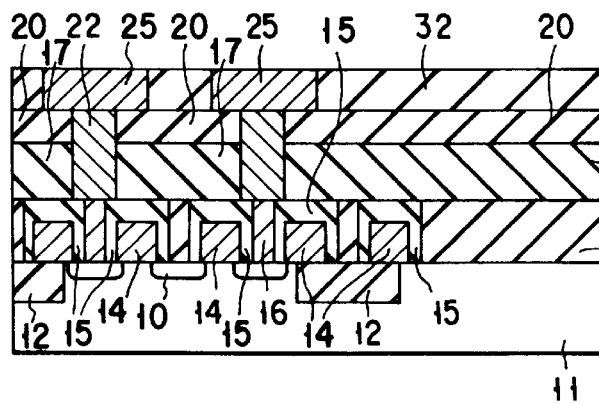 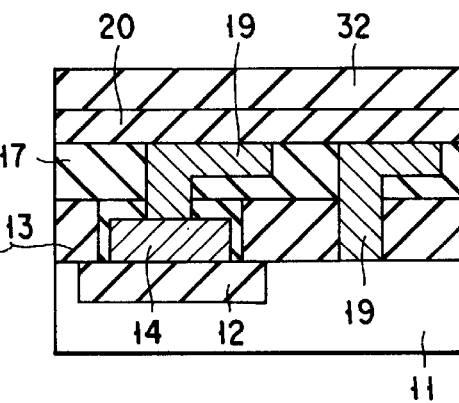
FIG. 16A  FIG. 16B
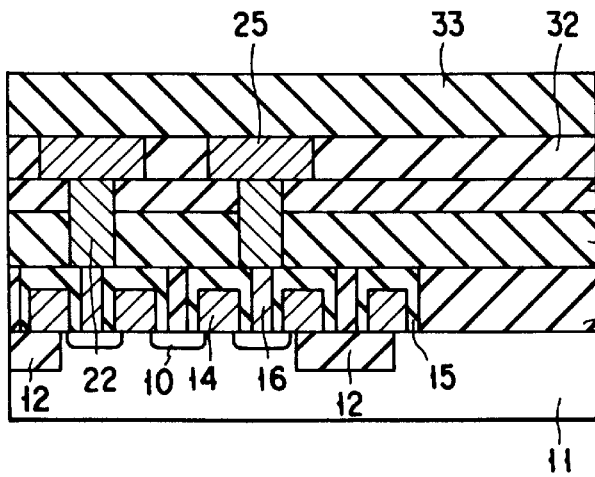 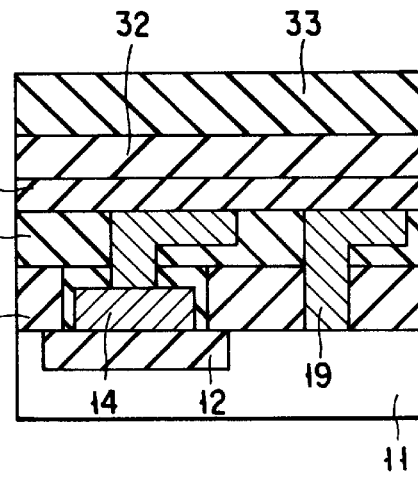
FIG. 17A  FIG. 17B

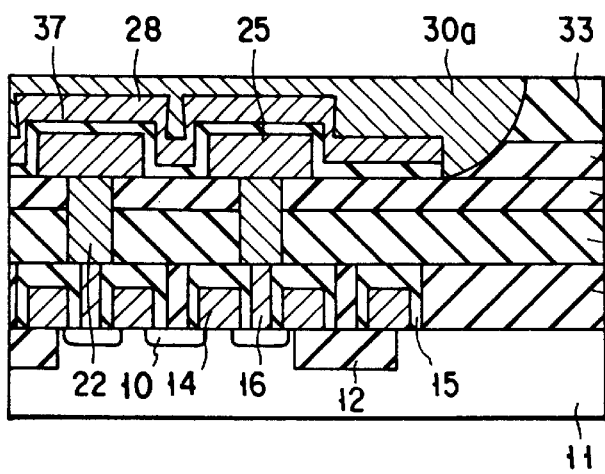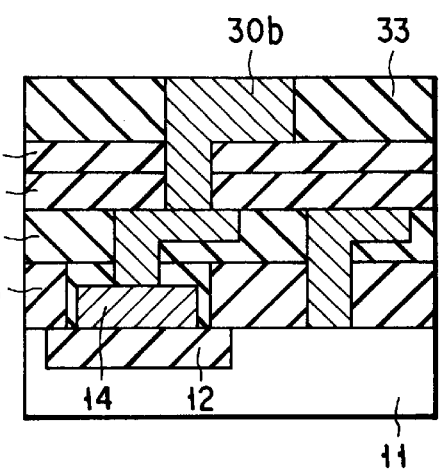
FIG. 21A  FIG. 21B
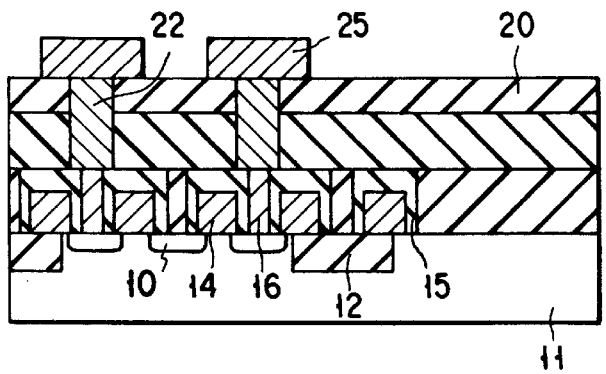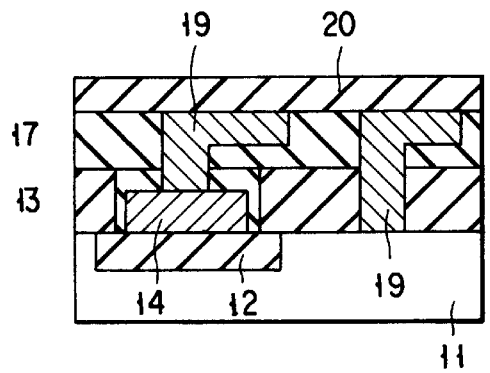
FIG. 22A  FIG. 22B
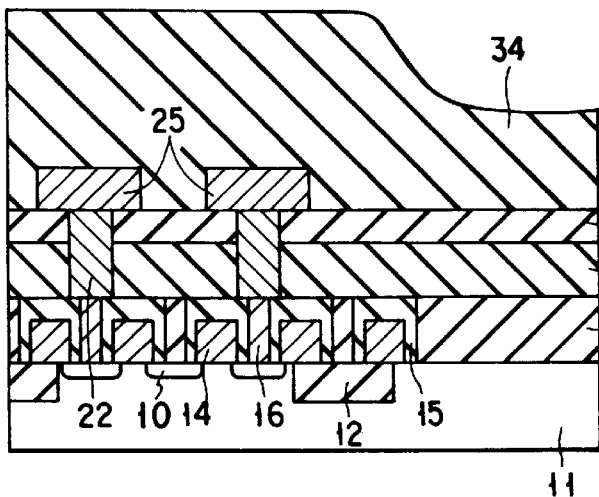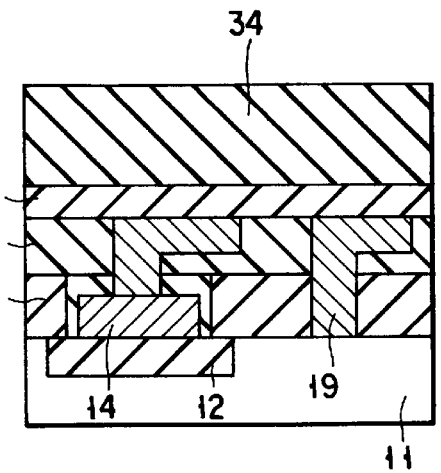
FIG. 23A  FIG. 23B

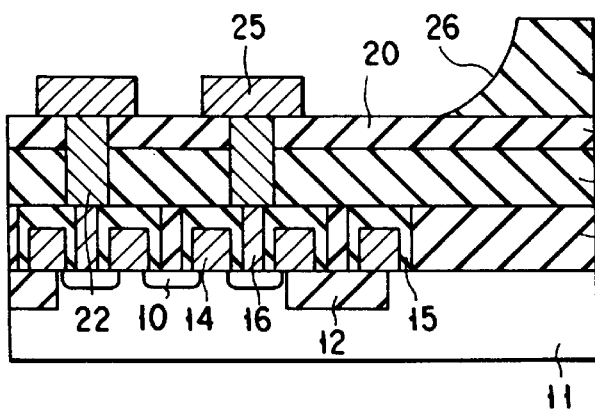
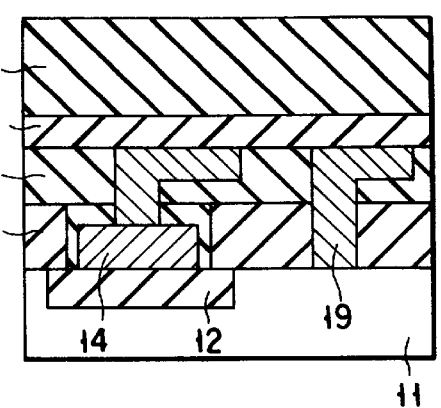
FIG. 24A  FIG. 24B
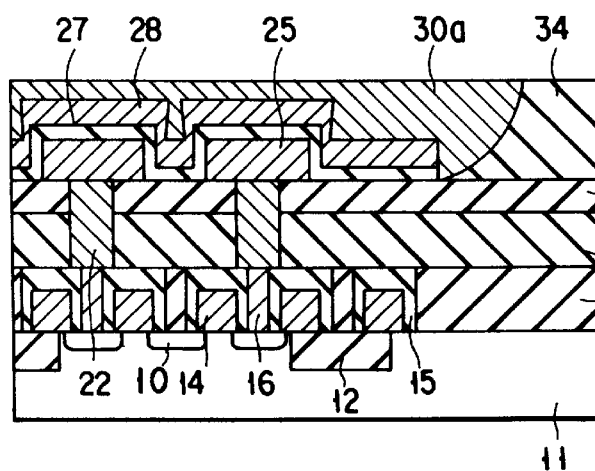
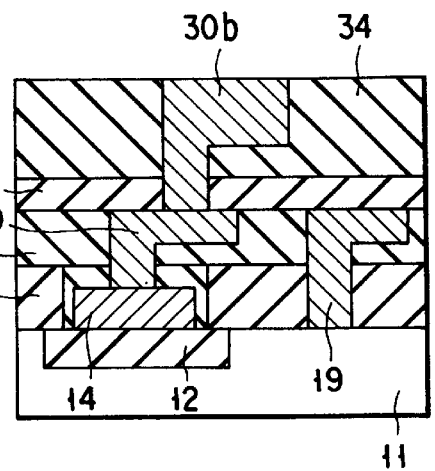
FIG. 25A  FIG. 25B
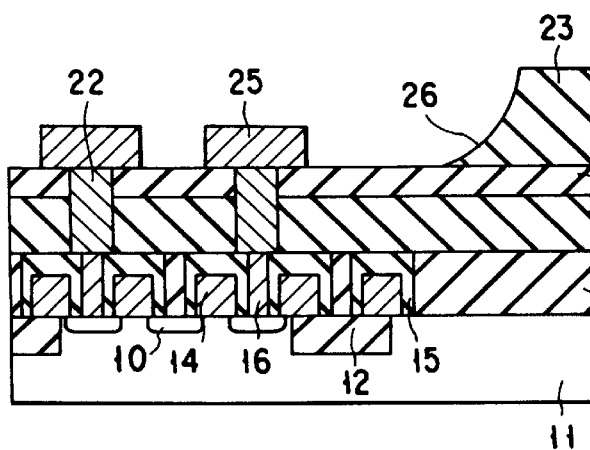
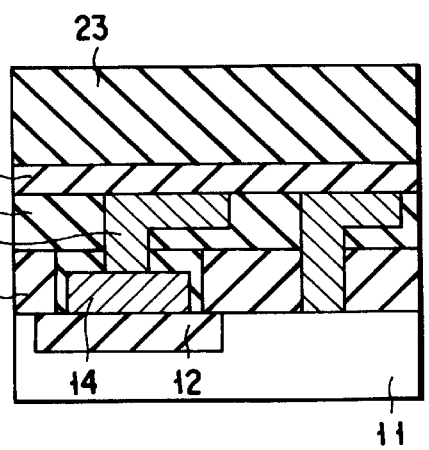
FIG. 26A  FIG. 26B

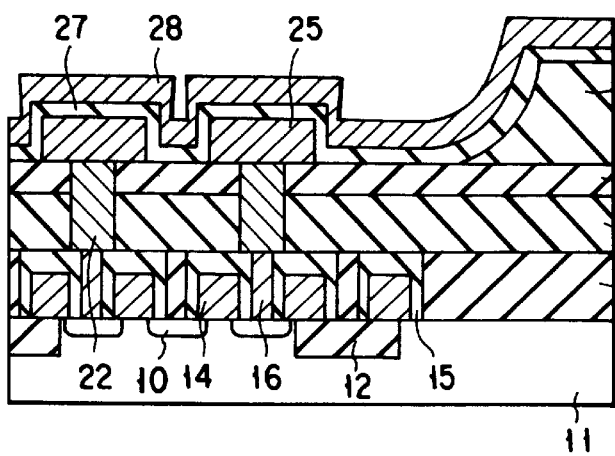 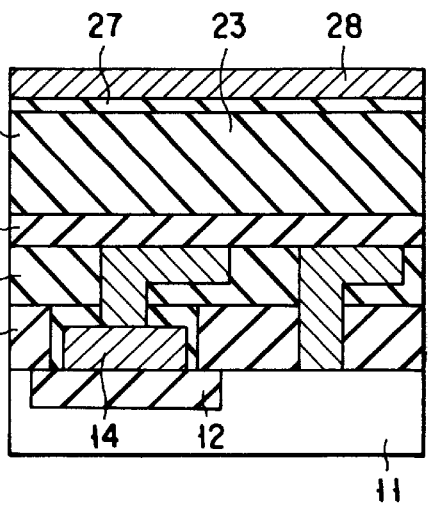
FIG. 27A  FIG. 27B
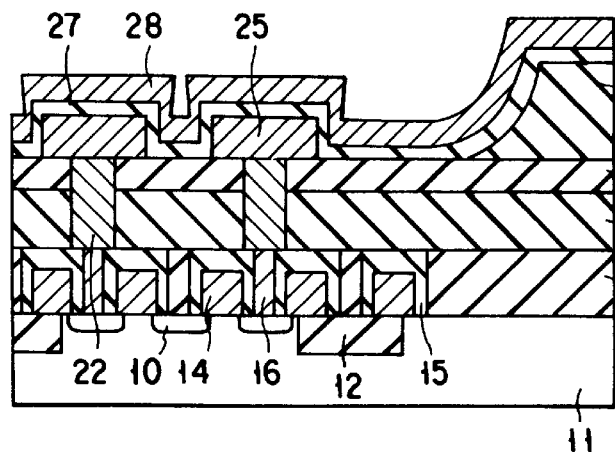 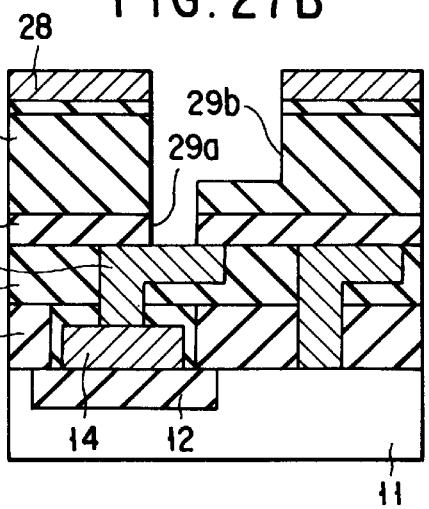
FIG. 28A  FIG. 28B
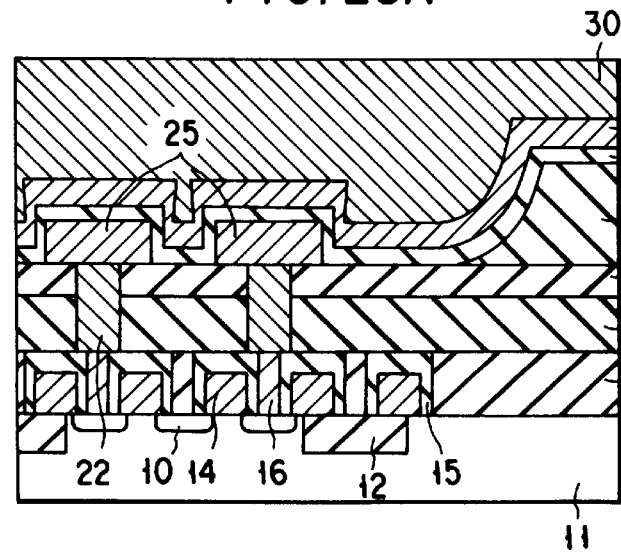 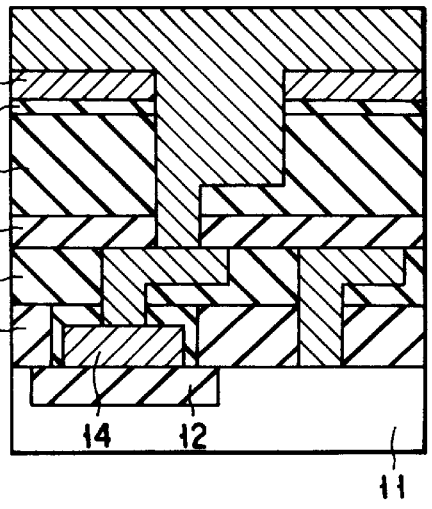
FIG. 29A  FIG. 29B

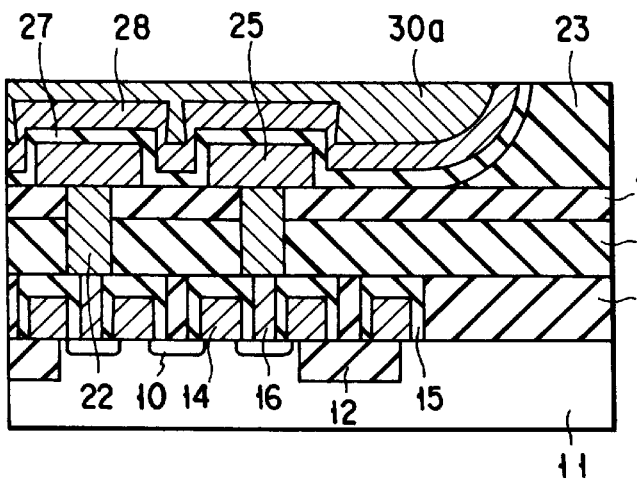
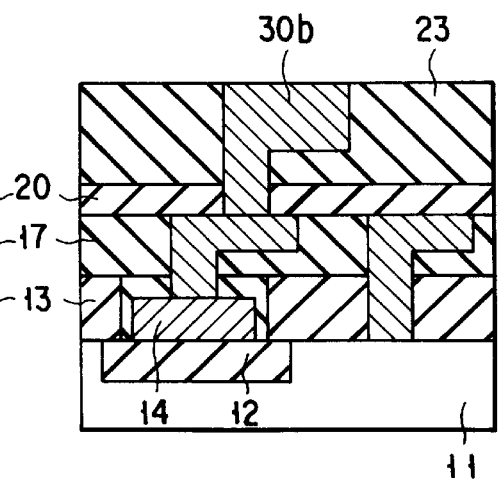
FIG. 30A    FIG. 30B
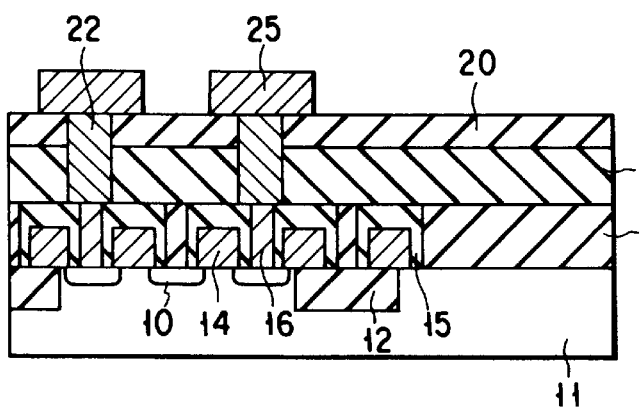
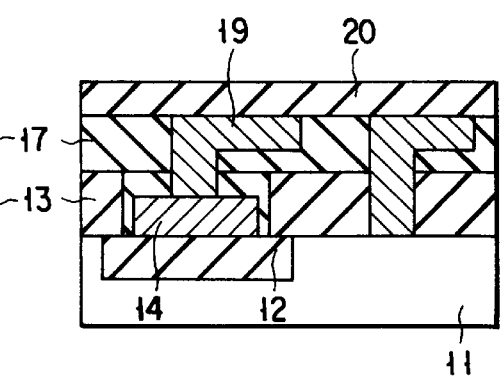
FIG. 31A    FIG. 31B
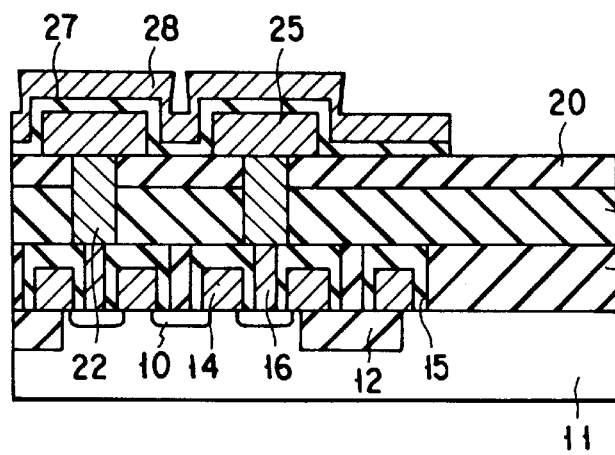
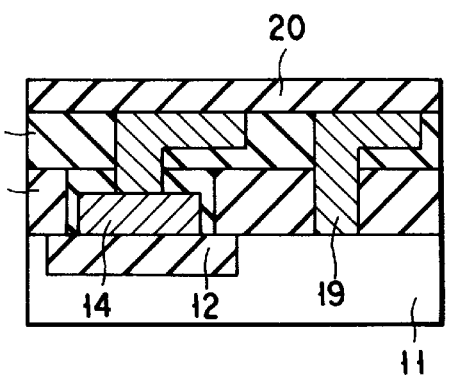
FIG. 32A    FIG. 32B

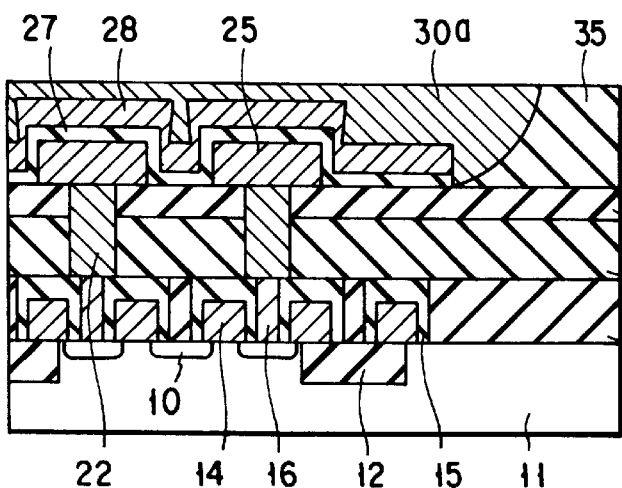
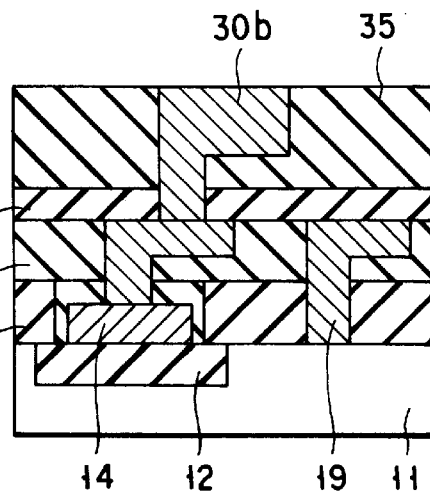
FIG. 36A  FIG. 36B
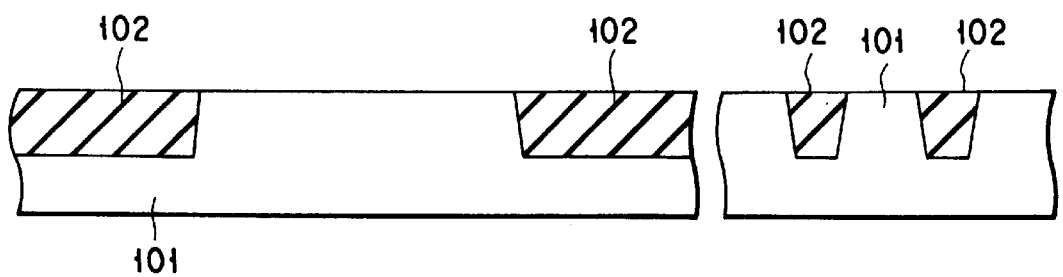
FIG. 37A  FIG. 37B
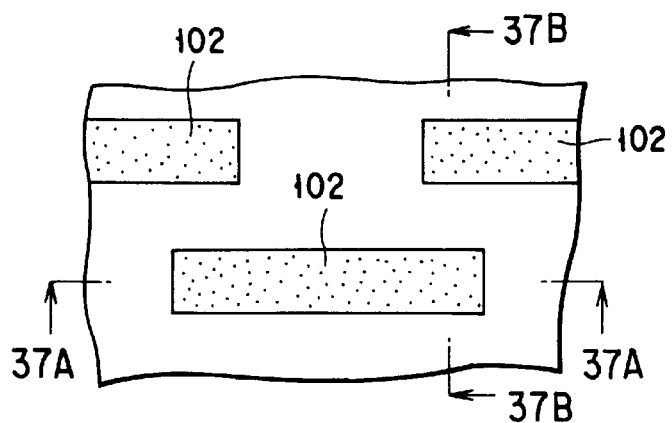
FIG. 37C

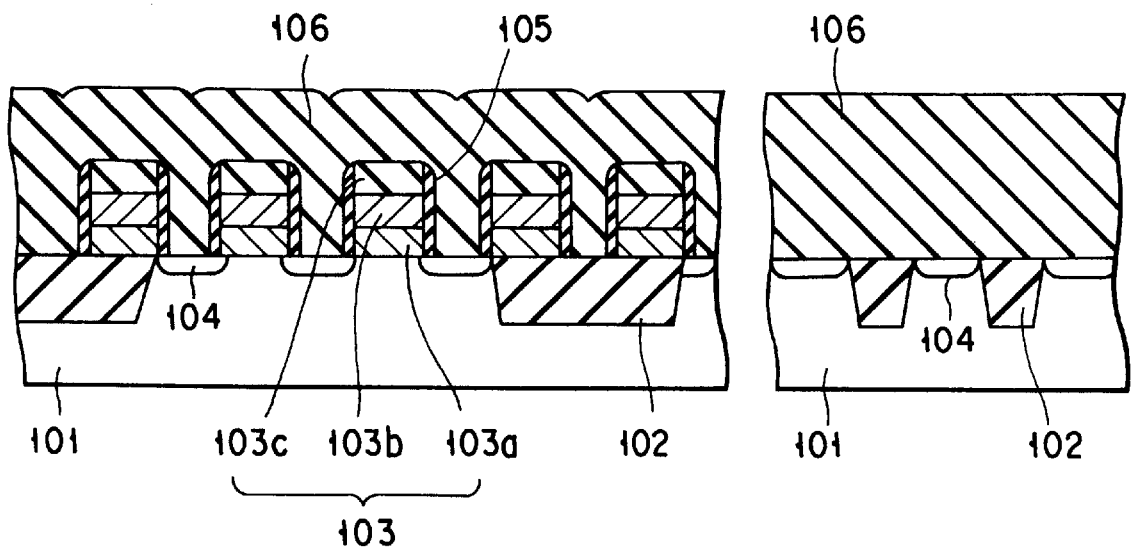
FIG. 38A
FIG. 38B
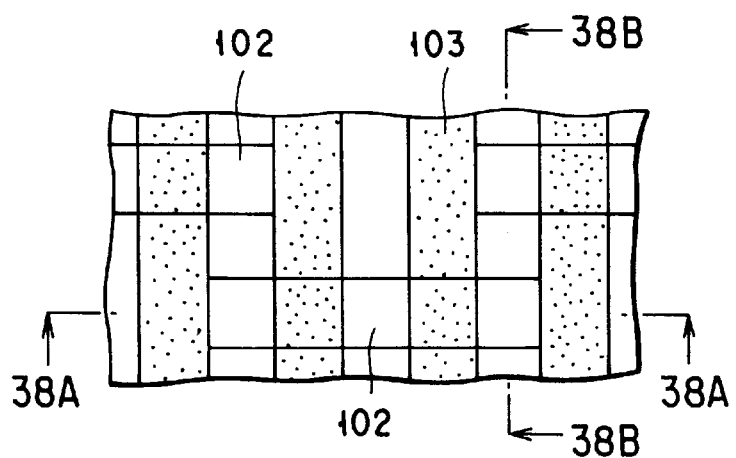
FIG. 38C

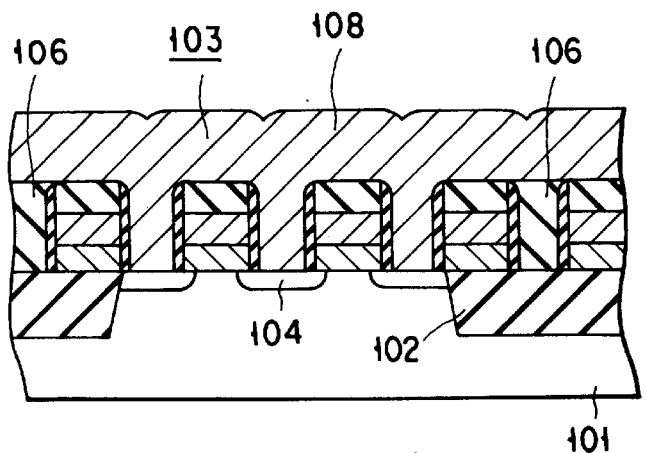
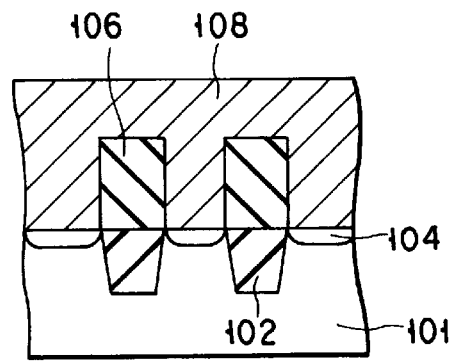
FIG. 40A  FIG. 40B
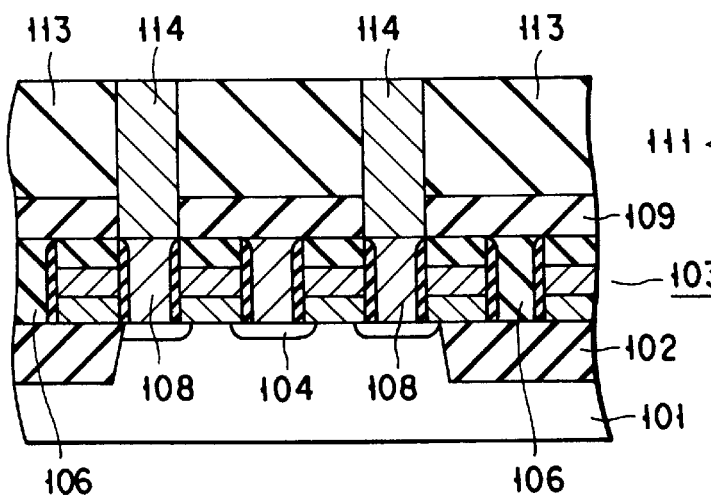
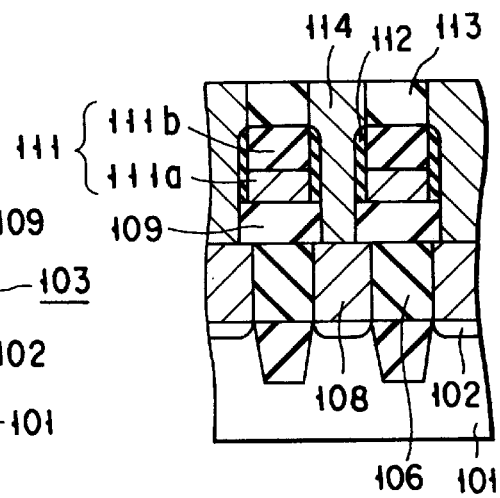
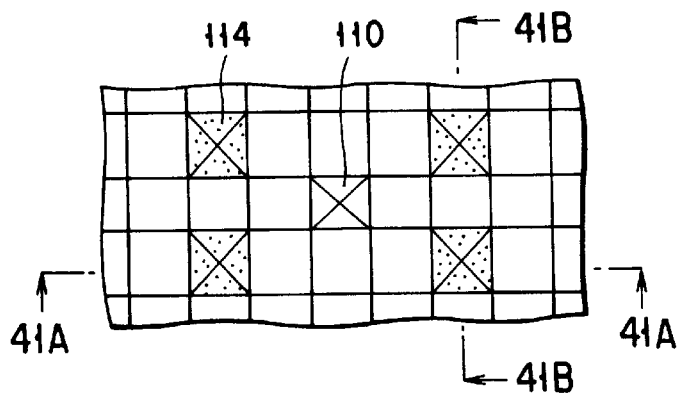
FIG. 41A  FIG. 41B
FIG. 41C

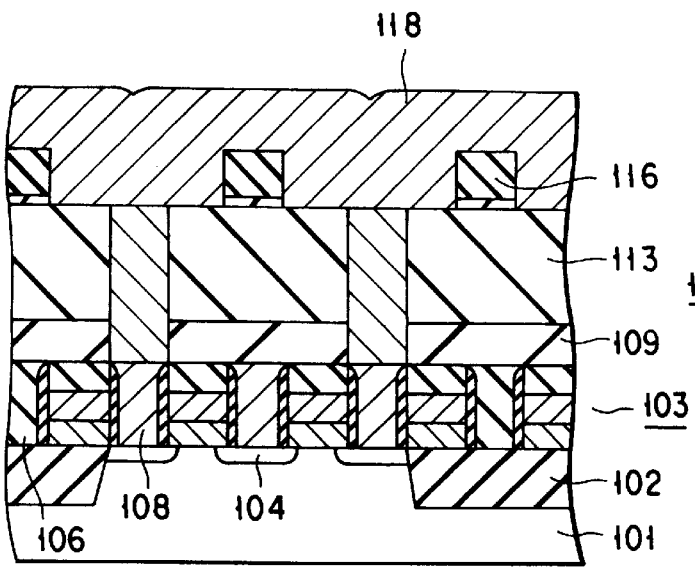 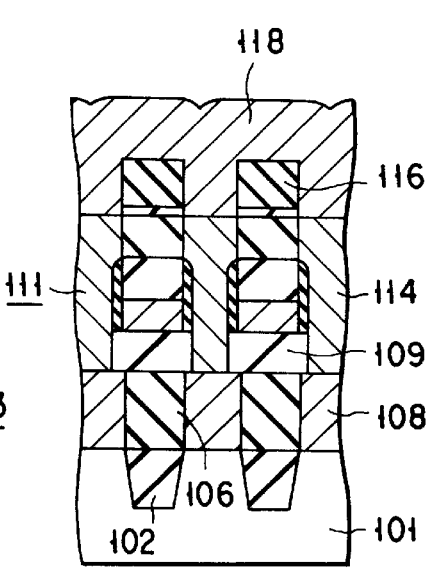
FIG. 43A        FIG. 43B
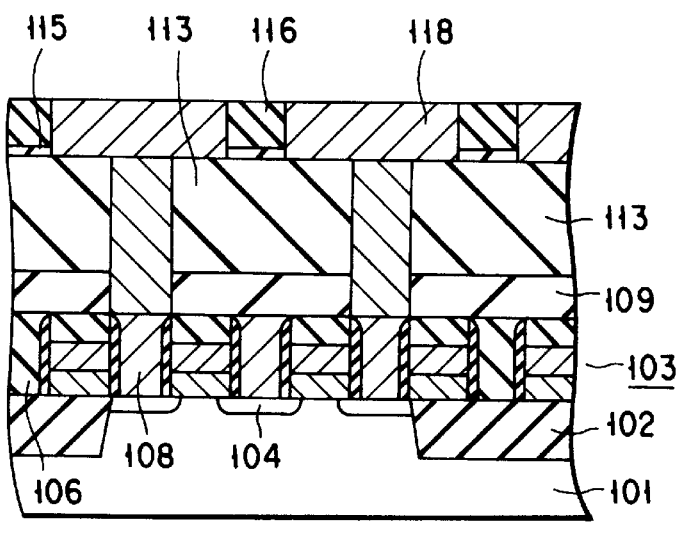 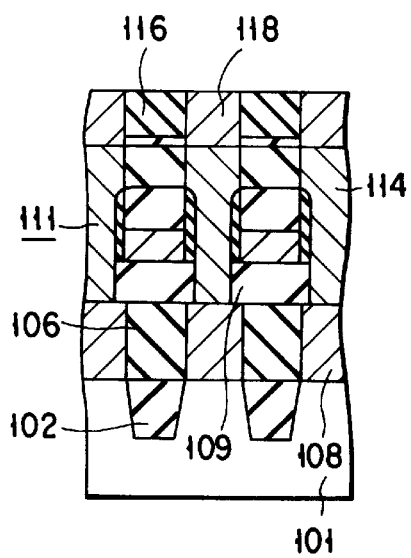
FIG. 44A        FIG. 44B

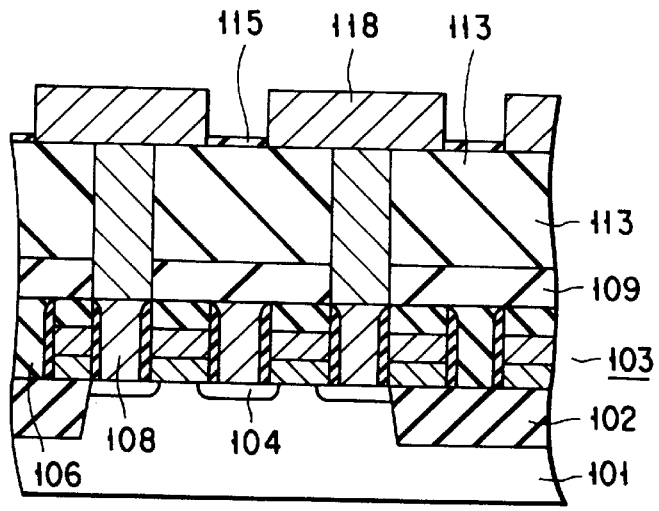 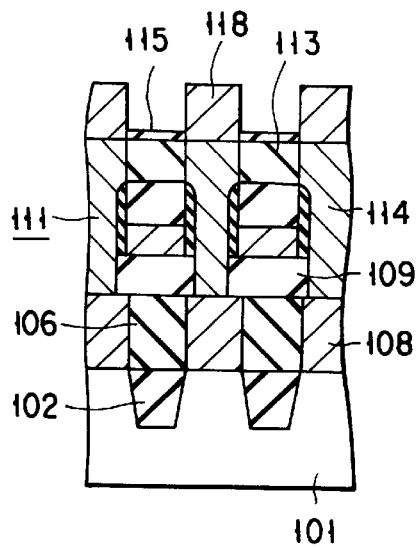
FIG. 45A  FIG. 45B
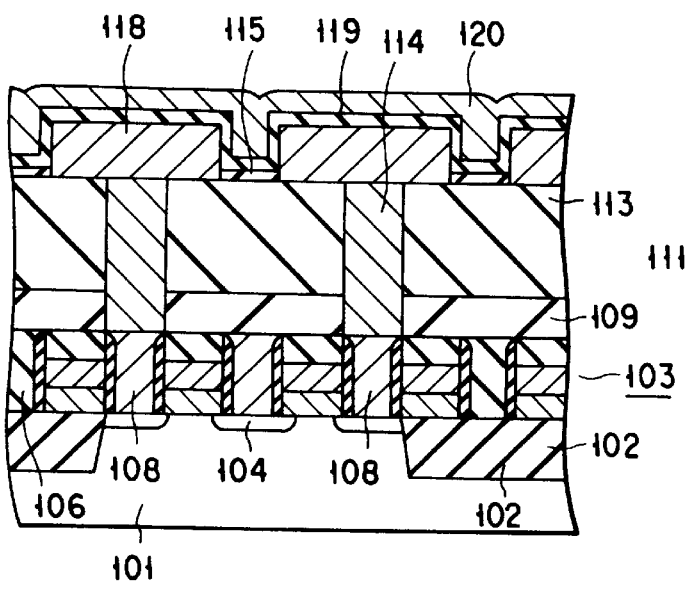 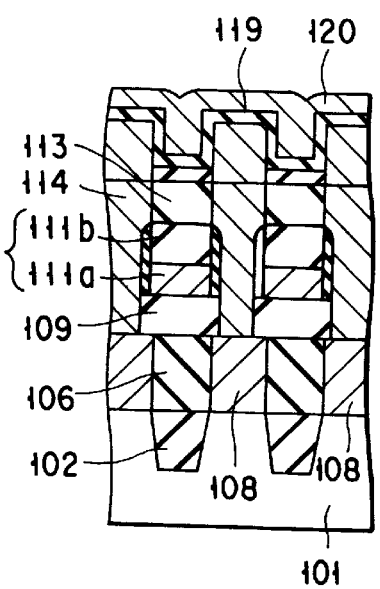
FIG. 46A  FIG. 46B

SEMICONDUCTOR MEMORY AND METHOD OF FABRICATING THE SAME

BACKGROUND OF THE INVENTION

The present invention relates to a semiconductor memory and a method of fabricating the same.

In fabricating reliable semiconductor memories such as DRAMs, it is required to, e.g., decrease the resistance of a capacitor electrode or an interconnection, reduce the fabrication steps to provide inexpensive devices, and planarize the surface in each step, particularly, in a lithography step to widen the process margin for lithography.

One conventional method of fabricating a DRAM having a stacked capacitor is to form an interconnection such as a bit line, form a contact for connecting the storage node electrode of a capacitor and form the storage node electrode, form a capacitor insulating film and a plate electrode, and form an upper interconnection (e.g., IEDM95-907).

When the fabrication method as described above is used, however, although the resistance of the capacitor electrode can be decreased by improving the plate electrode material, planarization when lithography is performed is not realized. Accordingly, it is not easy to fabricate devices, such as 1-Gbit DRAMs, having fine patterns.

Another example of conventional stacked capacitors is described in "P- Y. Lesaicherre et al., "A Gbit-scale DRAM stacked capacitor technology with ECR MOCVD $SrTiO_3$ and RIE patterned $RuO_2$/TiN storage nodes", IEDM Technical Digest, pp. 831–834, 1994".

The technology described in this reference will be briefly described below with reference to FIGS. 1A to 1D.

First, a 600-nm thick thermal oxide film 162 is formed on a silicon substrate 161, and a contact hole is formed in this thermal oxide film 162. Subsequently, a polysilicon plug 163 is formed in this contact hole (FIG. 1A). A TiN film 164 and a 500-nm thick $RuO_2$ film 165 are formed on the entire surface by sputtering (FIG. 1B). Next, an island resist mask 166 is formed on the $RuO_2$ film 165 by using lithography and used as a mask to pattern the $RuO_2$ film 165 and the TiN film 164 by RIE (FIG. 1C). After a surface treatment is performed for the $RuO_2$ film 165, an $SrTiO_3$ film 167 is deposited by ECRMOCVD. Finally, a TiN film and an Al film 168 are formed on the entire surface by sputtering to complete an (Al/TiN/$SrTiO_3$/$RuO_2$/TiN/poly-Si) stacked capacitor including Al as the plate electrode 168, $SrTiO_3$ as the capacitor insulating film 167, and the $RuO_2$ film as the storage electrode 165 (FIG. 1D).

The above description relates only to the fabrication steps of the storage node electrode contact and the capacitor. When the above method is applied to an actual DRAM, the steps of forming a MOSFET and a bit line are added to the above steps, and the polysilicon plug is connected to the source or drain of the MOSFET, rather than the silicon substrate.

In the above conventional technology, however, the storage nodes are separated by patterning the storage node conductive film 165 by using the island resist pattern as a mask. Accordingly, the adjacent storage nodes cannot be made closer to each other than the lithography limit. Consequently, the effective storage node area cannot be well increased.

Also, when a plurality of storage nodes 165 are arranged in a matrix manner as shown in FIG. 2A in the above conventional technology, if the storage node electrodes 165 and storage node contacts 163 are misaligned as shown in a sectional view of FIG. 2B taken along a line 2B—2B in FIG. 2A, a capacitor with a structure in which a plate electrode 168 and the storage node contacts 163 oppose each other via a capacitor insulating film 167 is formed. If this is the case, the combination of the materials of the two components can lead to deterioration of the capacitor characteristics, e.g., deterioration of the insulating properties of the capacitor insulating film 167.

As described above, it is conventionally difficult to perform planarization in lithography and not easy to form fine patterns.

It is also difficult to increase the area of the storage node electrode because the storage nodes cannot be made closer to each other than the lithography limit. Additionally, the capacitor characteristics readily deteriorate due to the misalignment between the storage node electrode and the storage node contact.

BRIEF SUMMARY OF THE INVENTION

It is the first object of the present invention to provide a semiconductor memory which can achieve planarization in the formation of a storage capacitor, and a method of fabricating the same.

It is the second object of the present invention to provide a semiconductor memory which can achieve a wide capacitor area and has improved electrical characteristics and reliability, and a method of fabricating the same.

To achieve the above objects, a semiconductor memory according to the first aspect of the present invention comprises a semiconductor substrate, a memory cell portion formed on the semiconductor substrate and comprising a plurality of stacked capacitors formed on the semiconductor substrate, each of the stacked capacitors having a storage electrode formed on a bottom surface of a recess in an insulating layer, a capacitor insulating film formed on the storage electrode, and a plate electrode formed on the capacitor insulating film and lower than an upper edge of the recess, and a first multilayered interconnecting layer having an interconnecting layer including a plate interconnection connected to the plate electrode, and a peripheral circuit portion formed adjacent to the memory cell portion on the semiconductor substrate and comprising a second multilayered interconnecting layer, wherein the plate interconnection includes a portion so formed as to bury the recess and connected to the plate electrode, and the second multilayered interconnecting layer includes an interconnecting layer having an upper surface substantially leveled with an upper surface of the interconnecting layer including the plate interconnection of the first multilayered interconnecting layer.

In the above semiconductor memory, the resistance can be lowered by the interconnecting layers including the plate interconnection. Additionally, the upper surfaces of the interconnecting layers can be substantially leveled with each other in the memory cell region and the peripheral circuit region. As a consequence, planarization can be achieved.

A method of fabricating a semiconductor memory according to the second aspect of the present invention is a method of fabricating a semiconductor memory having a memory cell portion formation region including a capacitor and a peripheral circuit formation region on a semiconductor substrate, comprising the steps of forming, on the semiconductor substrate, an insulating interlayer having a first recess in the memory cell portion formation region and a storage electrode of the capacitor on a bottom surface of the first recess, forming a plate electrode on the storage electrode via a capacitor insulating film, forming a second recess in the insulating interlayer in the peripheral circuit portion, and burying a conductive film in the first and second recesses to simultaneously form interconnecting layers equal in level in the memory cell portion and the peripheral circuit portion.

In the above semiconductor memory fabrication method, the conductor film is simultaneously buried in the first and second recesses. Accordingly, the resistance can be lowered without increasing the number of the fabrication steps. In addition, planarization can be achieved because the heights of the interconnecting layers can be made substantially equal to each other in the region (memory cell region) where the first recess is formed and the region (peripheral circuit region) where the second recess is formed. Consequently, the process margin in lithography can be increased.

In the above fabrication method, it is also possible to form the insulating interlayer by an insulating film X and an insulating film Y formed on this insulating film X and perform the step of forming, on the semiconductor substrate, the insulating interlayer having the storage electrode of the capacitor on the bottom surface of the first recess by the steps of forming the insulating film X, selectively removing the insulating film X, burying the storage electrode in a portion from which the insulating film X is selectively removed, forming the insulating film Y on the insulating film X and the storage electrode, and selectively removing the insulating films X and Y to form the first recess in which the storage electrode is formed.

In the above fabrication method, the step of forming, on the semiconductor substrate, the insulating interlayer having the storage electrode of the capacitor on the bottom surface of the first recess can be performed by the steps of forming the storage electrode, forming the insulating interlayer so as to cover the storage electrode, and selectively removing the insulating interlayer to form the first recess in which the storage electrode is formed.

In the above fabrication method, the step of forming, on the semiconductor substrate, the insulating interlayer having the storage electrode of the capacitor on the bottom surface of the first recess can be performed by the steps of forming the storage electrode, the capacitor insulating film, and the plate electrode, forming the insulating interlayer so as to cover the plate electrode, and selectively removing the insulating interlayer to form the first recess in which the storage electrode, the capacitor insulating film, and the plate electrode are formed.

A semiconductor memory according to the third aspect of the present invention comprises a semiconductor substrate having a major surface, a first insulating film formed on the major surface of the semiconductor substrate, a first contact plug formed in the first insulating film and electrically connected to the semiconductor substrate, a first conductor film formed on a part of the first insulating film and on a part of the first contact plug, and a second insulating film evenly and selectively covering a region on the first insulating film and on the first contact plug other than a region where the first conductor film is formed.

In the above semiconductor memory, the second insulating film (generally, the stopper insulating film in the etching step) is formed in a region on the first insulating film where the first conductor film (generally, the storage node electrode) is not formed. Therefore, even if the first contact (generally, the storage node contact) and the first conductor film are misaligned, deterioration of the insulating properties or the like caused by a capacitor (formed by sandwiching the second and third insulating films between the first conductor film and the second conductor film (generally, the plate electrode)) formed in this misaligned region can be prevented because in this misaligned region the second insulating film is formed in addition to the third insulating film (generally, the capacitor insulating film). Therefore, deterioration of the performance of the whole capacitor can be prevented, and a reliable semiconductor memory (e.g., a DRAM) can be obtained.

Alternatively, the semiconductor memory according to the third aspect comprises a semiconductor substrate having a major surface, a MOS transistor formed on the major surface of the semiconductor substrate and surrounded by an element isolation film, a first insulating film formed on the major surface of the semiconductor substrate, a first contact plug formed in the first insulating film and electrically connected to the semiconductor substrate, a bit line formed on the first insulating film and electrically connected to one of a source and a drain of the MOS transistor, a second insulating film formed on the first insulating film on which the bit line is formed, a second contact plug formed to extend through the first and the second insulating film and electrically connected to the other one of the source and the drain of the MOS transistor, a first conductor film formed on a part of the second insulating film and on a part of second contact plug, a third insulating film evenly and selectively covering a region on the second insulating film and the second contact plug other than a region where the first conductor film is formed, a fourth insulating film formed on the first conductor film and the third insulating film, and a second conductor film formed on the fourth insulating film.

A method of fabricating a semiconductor memory according to the fourth aspect of the present invention comprises the steps of forming a first insulating film on a major surface of a semiconductor substrate, forming a first contact plug electrically connected to the semiconductor substrate in the first insulating film, forming a second insulating film on the first insulating film and the first contact plug, forming a third insulating film on the second insulating film, forming a trench which extends through the second and the third insulating film and in which a part of a surface of the first contact plug and a part of a surface of the first insulating film is exposed, forming a first conductor film in the trench, and removing the third insulating film.

In the above semiconductor memory fabrication method, even if the positions of the first contact (generally, the storage node contact) and the first conductor film are deviated from each other by misalignment or the like, deterioration of the insulating properties or the like caused by a capacitor (formed by sandwiching the second and third insulating films between the first conductor film and the second conductor film (generally, the plate electrode)) formed in this misaligned region can be prevented because in this misaligned region the second insulating film (generally, the stopper insulating film in the etching step) is formed in addition to the third insulating film (generally, the capacitor insulating film). Therefore, deterioration of the performance of the whole capacitor can be prevented, and a reliable semiconductor memory (e.g., a DRAM) can be fabricated.

Alternatively, the method of fabricating a semiconductor memory according to the fourth aspect of the present invention comprises the steps of forming a MOS transistor surrounded by an element isolation film on a major surface of a semiconductor substrate, forming a first insulating film on the major surface of the semiconductor substrate on which the MOS transistor is formed, forming a first contact plug electrically connected to one of a source and a drain of the MOS transistor in the first insulating film, forming a bit line connected to the first contact plug on the first insulating film, forming a second insulating film on the first insulating film on which the bit line is formed, forming a second contact plug extending through the first and the second insulating film and electrically connected to the other one of the source and the drain of the MOS transistor, forming a third insulating film on the second insulating film and the second contact plug, forming a fourth insulating film on the third insulating film, forming a trench which extends through the third and the fourth insulating film and in which a part of a surface of the second contact plug and a part of a surface of the first insulating film is exposed, forming a first conductor film in the trench, removing the fourth insulating film to expose a surface of the third insulating film, forming a fifth insulating film on the third insulating film and the first conductor film which are exposed, and forming a second conductor film on the fifth insulating film.

In the above fabrication method, the effects described previously can be obtained. Additionally, since the first conductor film is buried in the trench, the area of this first conductor film buried in the trench can be increased by widening the trench by isotropic etching such as wet etching. Consequently, the area of the capacitor and therefore the capacitance of the capacitor can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 11A, 12A . . . 15A are sectional views showing steps in fabricating a memory cell portion of a semiconductor memory according to the second embodiment of the present invention in order of steps;

FIGS. 11B, 12B . . . 15B are sectional views showing steps in fabricating a peripheral circuit portion of the semiconductor memory according to the second embodiment of the present invention in order of steps, respectively corresponding to the memory cell portions in FIGS. 11A, 12A . . . 15A;

FIGS. 16A, 17A . . . 21A are sectional views showing steps in fabricating a memory cell portion of a semiconductor memory according to the third embodiment of the present invention in order of steps;

FIGS. 16B, 17B . . . 21B are sectional views showing steps in fabricating a peripheral circuit portion of the semiconductor memory according to the third embodiment of the present invention in order of steps, respectively corresponding to the memory cell portions in FIGS. 16A, 17A . . . 21A;

FIGS. 22A, 23A . . . 25A are sectional views showing steps in fabricating a memory cell portion of a semiconductor memory according to the fourth embodiment of the present invention in order of steps;

FIGS. 22B, 23B . . . 25B are sectional views showing steps in fabricating a peripheral circuit portion of the semiconductor memory according to the fourth embodiment of the present invention in order of steps, respectively corresponding to the memory cell portions in FIGS. 22A, 23A . . . 25A;

FIGS. 26A, 27A . . . 30A are sectional views showing steps in fabricating a memory cell portion of a semiconductor memory according to the fifth embodiment of the present invention in order of steps;

FIGS. 26B, 27B . . . 30B are sectional views showing steps in fabricating a peripheral circuit portion of the semiconductor memory according to the fifth embodiment of the present invention in order of steps, respectively corresponding to the memory cell portions in FIGS. 26A, 27A . . . 30A;

FIGS. 31A, 32A . . . 36A are sectional views showing steps in fabricating a memory cell portion of a semiconductor memory according to the sixth embodiment of the present invention in order of steps;

FIGS. 31B, 32B . . . 36B are sectional views showing steps in fabricating a peripheral circuit portion of the semiconductor memory according to the sixth embodiment of the present invention in order of steps, respectively corresponding to the memory cell portions in FIGS. 31A, 32A . . . 36A;

FIGS. 37A to 37C are views showing the first step of a fabrication process according to the seventh embodiment of the present invention, in which FIG. 37C is a plan view and FIGS. 37A and 37B are sectional views taken along lines 37A—37A and 37B—37B, respectively, in FIG. 37C;

FIGS. 38A to 38C are views showing the step following FIGS. 37A to 37C;

FIGS. 40A and 40B are views showing the step following FIGS. 39A and 39B;

FIGS. 41A to 41C are views showing the step following FIGS. 40A and 40B;

FIGS. 43A and 43B are views showing the step following FIGS. 42A and 42B;

FIGS. 44A and 44B are views showing the step following FIGS. 43A and 43B;

FIGS. 45A and 45B are views showing the step following FIGS. 44A and 44B;

FIGS. 46A and 46B are views showing the step following FIGS. 45A and 45B;

DETAILED DESCRIPTION OF THE INVENTION

Embodiments in which the present invention is applied to a dynamic DRAM including a stacked capacitor will be described below with reference to the accompanying drawings.

(First Embodiment)

The first embodiment of the present invention will be described below in accordance with fabrication steps shown in FIGS. 3A to 10A and 3B to 10B. FIGS. 3A to 10A primarily show a region (memory array region) having a capacitor, and FIGS. 3B to 10B primarily show a region (peripheral circuit region) having no capacitor. These two regions are formed on the same semiconductor substrate (this applies to drawings according to other embodiments).

Figure 1A:
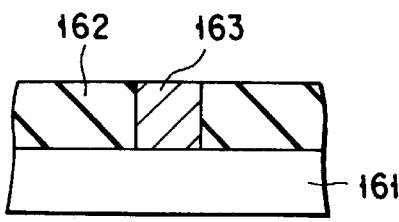
FIGS. 1A to 1D are sectional views of a capacitor portion of a semiconductor memory showing steps in fabricating a capacitor according to a conventional technology in order of steps.
Figure 1B:
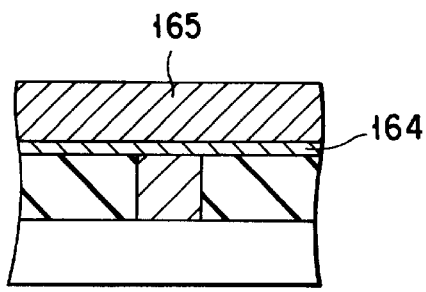
Figure 1C:
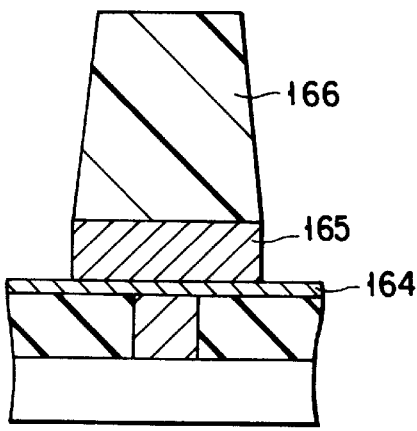
Figure 1D:
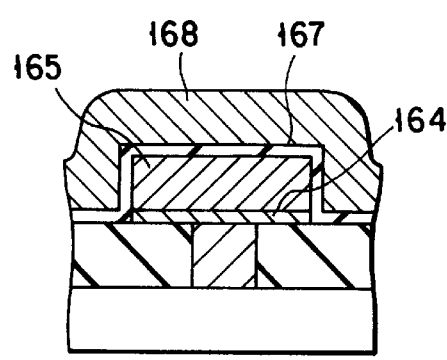
Figure 2A:
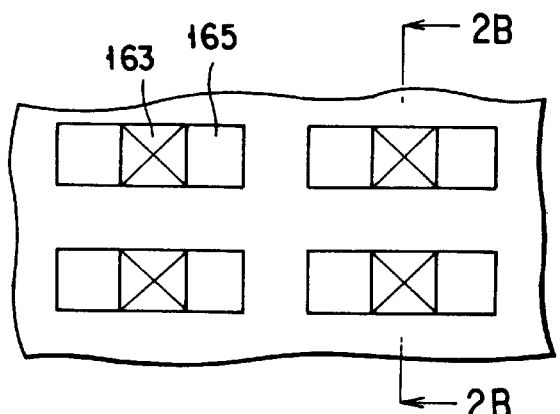
FIGS. 2A and 2B are views for explaining the problem of the capacitor of the conventional technology.
Figure 2B:
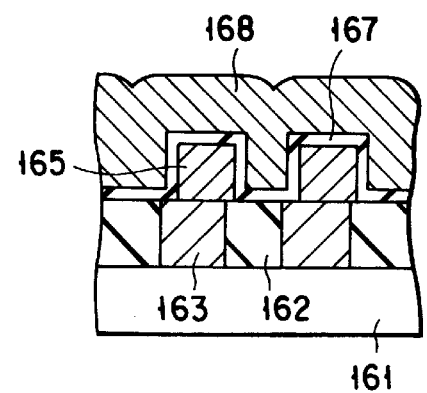
Figures 3A, 3B:
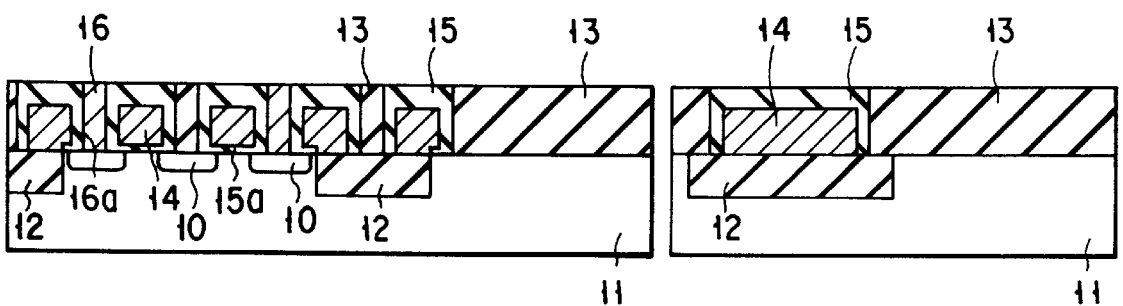
FIGS. 3A, 4A . . . 10A are sectional views showing steps in fabricating a memory cell portion of a semiconductor memory according to the first embodiment of the present invention in order of steps.
FIGS. 3B, 4B . . . 10B are sectional views showing steps in fabricating a peripheral circuit portion of the semiconductor memory according to the first embodiment of the present invention in order of steps, respectively corresponding to the memory cell portions in FIGS. 3A, 4A . . . 10A.

First, a gate insulating film 15a and gate electrode 14 are formed on a silicon substrate 11 (semiconductor substrate) on which an element isolation insulating film 12 is formed. Source and drain diffusion layers 10 are formed on the surface of the silicon substrate 11. In addition, an insulating film 15 is formed around the gate electrode 14, and an insulating interlayer 13 is buried between the gate electrode 14. Subsequently, contact holes 16a are formed in predetermined regions of the insulating interlayer 13 by RIE. A conductive film such as a doped polysilicon film is deposited and etched back to form plugs 16 made of this conductive film in the contact holes (FIGS. 3A and 3B).

Figures 4A, 4B:
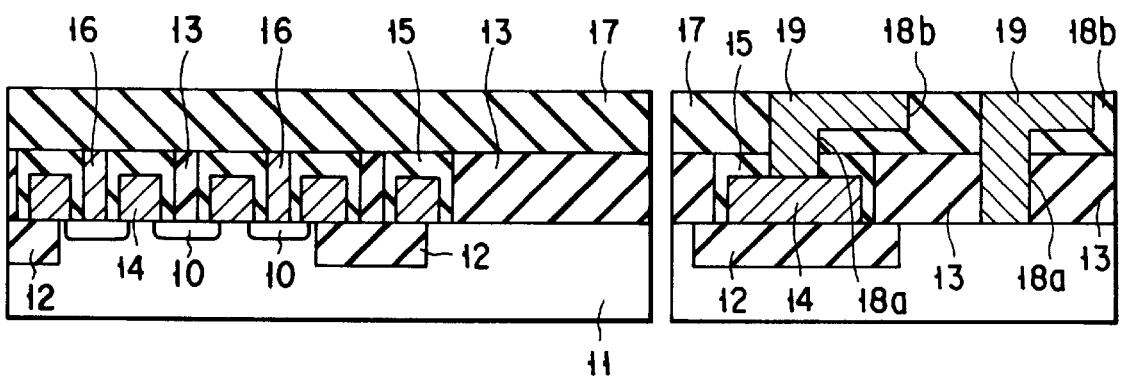

Next, an insulating interlayer 17 is deposited on the entire surface. In the peripheral circuit region, the insulating interlayer 17 and the insulating interlayer 13 are selectively removed by RIE or the like to form contact holes (not shown) and interconnection trenches 18a and 18b. A conductive film such as a W film is deposited by CVD on the entire surface and planarized by, e.g., RIE or CMP to form interconnections 19 (FIGS. 4A and 4B). It is noted that the gate insulating films 15a are not shown in FIG. 4A for the sake of simplicity. This applies to drawings hereinafter.

The interconnections 19 are used as bit lines (not shown) of a DRAM cell array region in FIG. 4A, so bit lines of a memory cell array can be simultaneously formed in this step. That is, in the contact hole formation step described above, bit line contact holes and bit line interconnection trenches can be simultaneously formed. Also, bit line plugs and bit lines can be simultaneously formed in the same step as the formation of the interconnections 19. This bit line is connected to one of the source and drain diffusion layers of the transistor, and a capacitor (to be described later) is connected to the other.

Figures 5A, 5B:
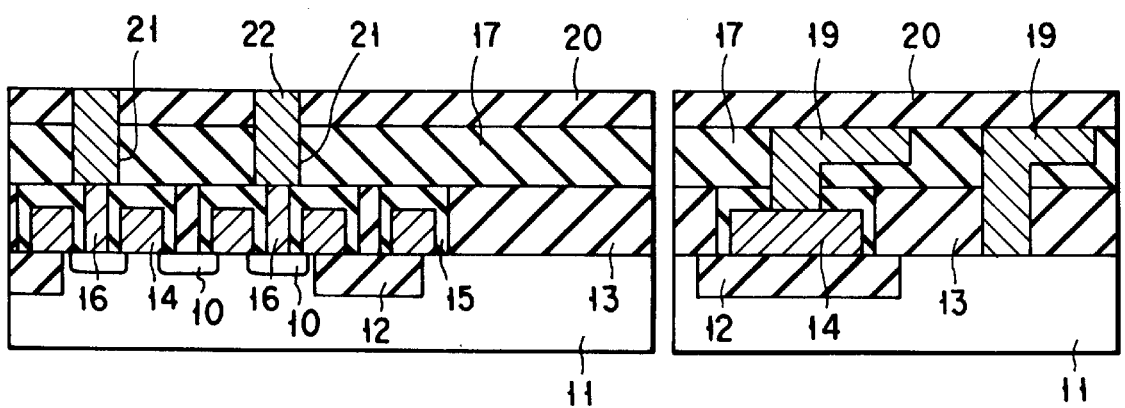

Subsequently, an insulating interlayer 20 is deposited by CVD on the entire surface, and this insulating interlayer 20 and the insulating interlayer 17 are selectively removed by RIE or the like to form contact holes 21. Plugs 22 connected to the plugs 16 are formed in these contact holes 21 (FIGS. 5A and 5B).

An insulating interlayer 23 is then deposited, and predetermined regions of this insulating interlayer 23 are removed by RIE to form holes 24, thereby exposing the surfaces of the plugs 22. After a conductive film is buried in the holes 24, RIE or the like is so performed that the upper surface of this conductive film is lower than the upper surface of the insulating interlayer 23, thereby forming a capacitor lower electrode layer 25 connected to the plugs 22. As the material of the conductive film serving as the lower electrode layer 25, it is possible to use, e.g., Pt (platinum), Ru (ruthenium), or $RuO_2$ (ruthenium oxide) (FIGS. 6A and 6B).

Next, a region having no capacitor is covered with a resist (not shown), and the insulating interlayer 23 in a region having capacitors is removed by, e.g., CDE (Chemical Dry Etching) or wet etching. Consequently, the insulating interlayer 20 is exposed to form a hole 26 (FIGS. 7A and 7B).

A capacitor insulating film 27 and a capacitor upper electrode layer 28 are then deposited on the entire surface, the region having capacitors is covered with a resist (not shown), and the capacitor insulating film 27 and the capacitor upper electrode layer 28 in the region having no capacitor are etched away to form capacitors. As the capacitor insulating film 27, a high-dielectric thin film made from, e.g., $SrTiO_3$ or $Ba_xSr_{1-x}TiO$ can be used. As the material of the conductive film serving as the capacitor upper electrode layer 28, it is possible to use, e.g., Pt, Ru, or $RuO_2$ as in the case of the lower electrode layer 25 (FIGS. 8A and 8B).

Figure 9A:
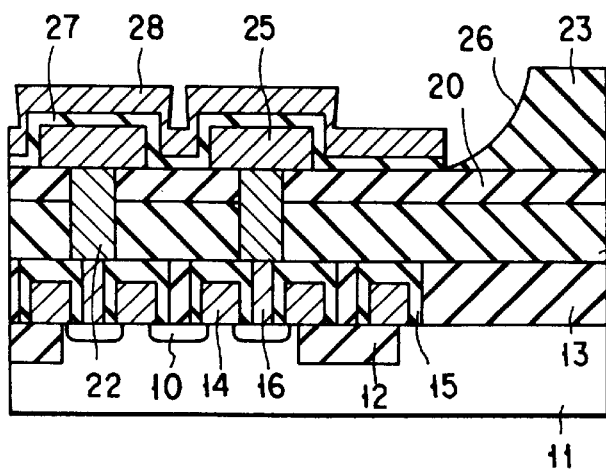
Figure 9B:
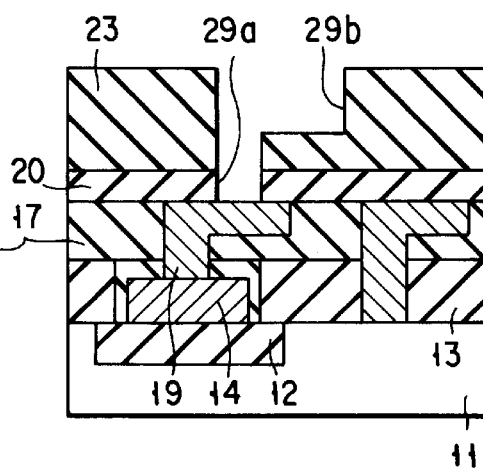

The insulating interlayer 23 and the insulating interlayer 20 in the peripheral circuit region are selectively removed by, e.g., RIE to form contact holes 29a and interconnection trenches 29b, thereby exposing the surfaces of the interconnections 19 (FIG. 9B).

Subsequently, a conductive film such as a W film is deposited by CVD on the entire surface and planarized by, e.g., etching back or CMP (Chemical Mechanical Polishing). In the region having the capacitors, a plate interconnection 30a which backs the capacitor upper electrode layer 28 is formed in the hole 26. At the same time, an interconnection 30b is formed in the holes 29a and 29b in the region having no capacitor (FIGS. 10A and 10B).

Figure 10A:
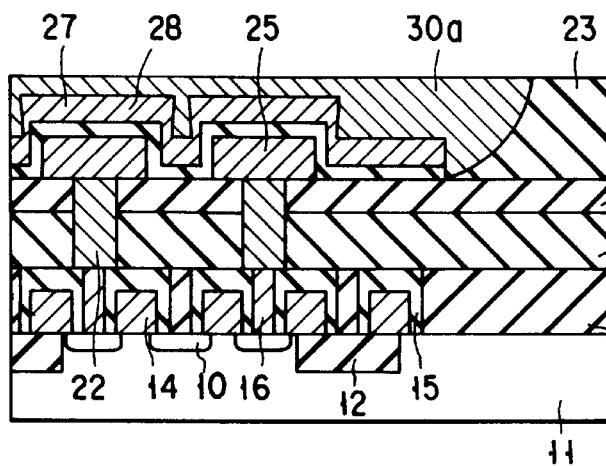
Figure 10B:
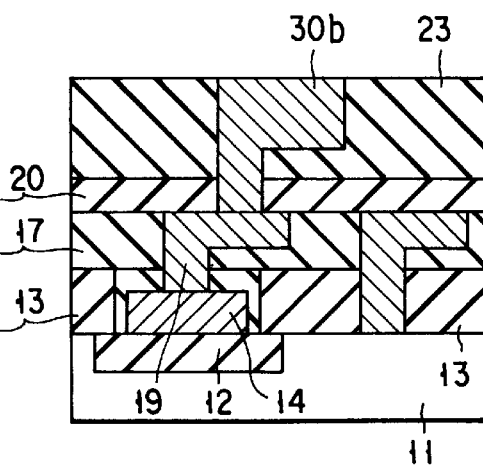

In the memory fabricated by the above process, as shown in FIGS. 10A and 10B, the distance between the upper surface of the capacitor upper electrode layer 28 and the upper surface of the silicon substrate 11 is smaller than the distance between the upper surface of the interconnection 30b and the upper surface of the silicon substrate 11. Additionally, the distances from the upper surfaces of the plate interconnection 30a, the interconnection 30b, and the insulating interlayer 23 to the upper surface of the silicon substrate 11 are equal. That is, the surface is planarized across the region having the capacitors and the region having no capacitor.

Also, in the fabrication process described above, the plate interconnection 30a and the interconnection 30b are simultaneously formed by simultaneously burying the conductive film in the holes 26, 29a, and 29b. This shortens the fabrication process.

(Second Embodiment)

The second embodiment of the present invention will be described below in accordance with fabrication steps shown in FIGS. 11A to 15A and 11B to 15B. Note that the basic constituent elements are substantially the same as in the above first embodiment, and some fabrication steps are also the same as in the first embodiment. For these elements and steps, therefore, reference is to be made to the corresponding drawings and explanations in the first embodiment unless otherwise specified, and a detailed description thereof will be omitted.

Figure 11A:
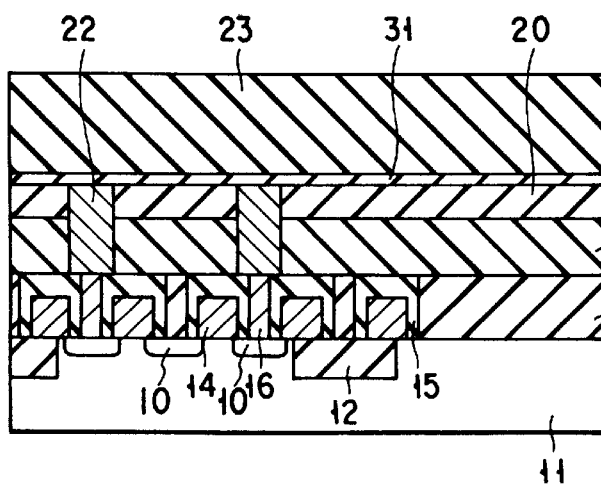
Figure 11B:
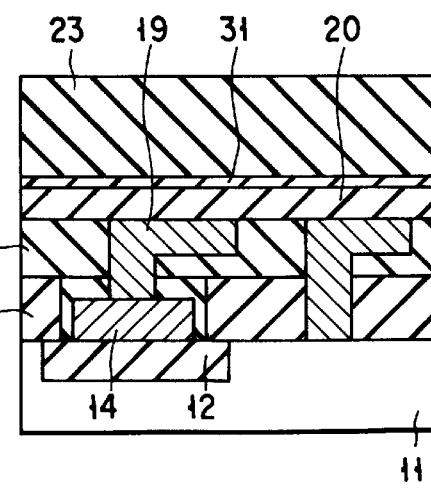

After FIGS. 5A and 5B in the first embodiment, an insulating film 31 and an insulating interlayer 23 are formed by CVD on the entire surface. The insulating film 31 functions as a stopper in etching performed to form a hole in the insulating interlayer 23 in a later step (FIGS. 11A and 11B).

Subsequently, predetermined regions of the insulating interlayer 23 and the insulating film 31 are removed to form holes 24 and expose the surfaces of plugs 22. A conductive film is buried in these holes 24 and etched by RIE or the like such that the upper surface of this conductive film is lower than the upper surface of the insulating interlayer 23, thereby forming a capacitor lower electrode layer 25 (FIGS. 12A and 12B).

Next, a region having no capacitor is covered with a resist (not shown), and the insulating interlayer 23 in a region having capacitors is removed by, e.g., CDE or wet etching to form a hole 26. Since the insulating film 31 serving as an etching stopper is formed below the insulating interlayer 23, the etching of the insulating interlayer 23 can be stopped at the insulating film 31 (FIG. 13A).

A capacitor insulating film 27 and a capacitor upper electrode layer 28 are then deposited, the region having capacitors is covered with a resist (not shown), and the capacitor insulating film 27 and the capacitor upper electrode layer 28 in the region having no capacitor are etched away to form capacitors. The insulating interlayer 23, the insulating film 31, and an insulating interlayer 20 are selectively removed by RIE or the like to form contact holes 29a and interconnection trenches 29b and expose the surfaces of interconnections 19 (FIGS. 14A and 14B).

Thereafter, as in FIGS. 10A and 10B of the first embodiment, a plate interconnection 30a which backs the capacitor upper electrode layer 28 is formed in the hole 26 in the region having the capacitors, and an interconnection 30b is formed in the holes 29a and 29b in the region having no capacitor (FIGS. 15A and 15B).

In the memory fabricated by the above process, functions and effects similar to those of the first embodiment can be obtained.

(Third Embodiment)

The third embodiment of the present invention will be described below in accordance with fabrication steps shown in FIGS. 16A to 21A and 16B to 21B. Note that the basic constituent elements are substantially the same as in the above first embodiment, and some fabrication steps are also the same as in the first embodiment. For these elements and steps, therefore, reference is to be made to the corresponding drawings and explanations in the first embodiment unless otherwise specified, and a detailed description thereof will be omitted.

After FIGS. 5A and 5B in the first embodiment, an insulating interlayer 32 is deposited by CVD on the entire surface, and predetermined regions of the insulating interlayer 32 are removed to form holes. Subsequently, a conductive film is deposited on the entire surface, and planarization is performed by using CMP or the like to bury this conductive film in the holes formed as above, thereby forming a capacitor lower electrode layer 25 (FIGS. 16A and 16B).

An insulating interlayer 33 is further deposited on the insulating interlayer 32 and the capacitor lower electrode layer 25 (FIGS. 17A and 17B).

Figure 18A:
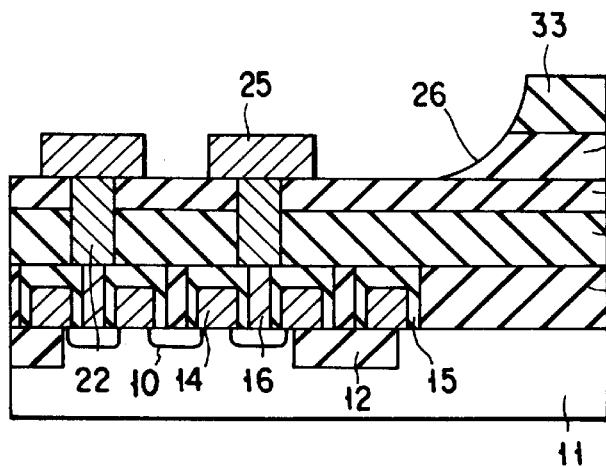
Figure 18B:
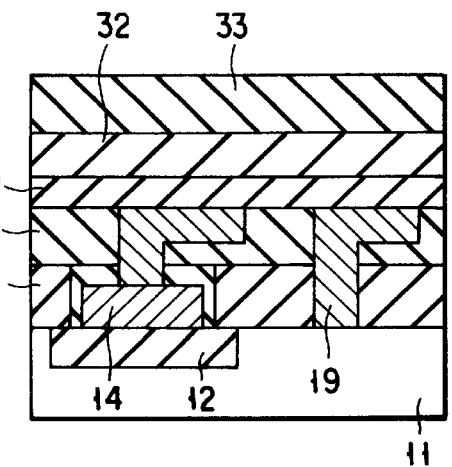
Figure 19A:
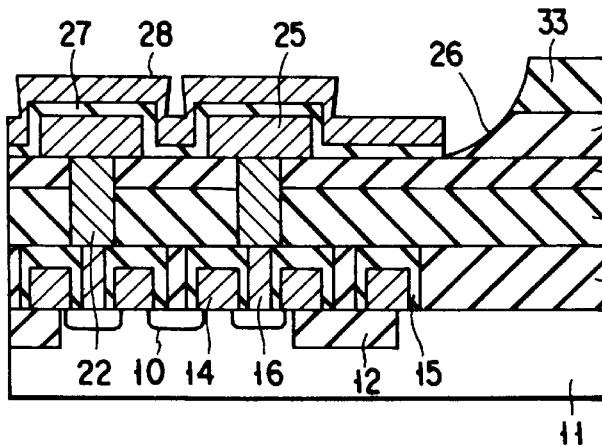
Figure 19B:
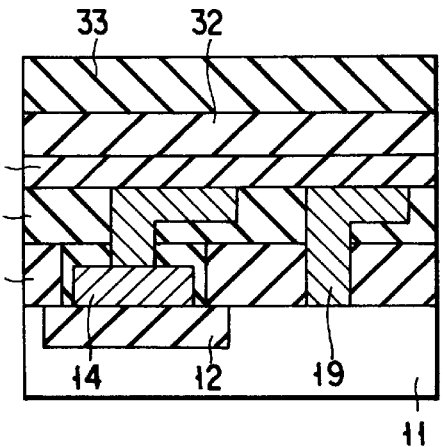
Figure 20A:
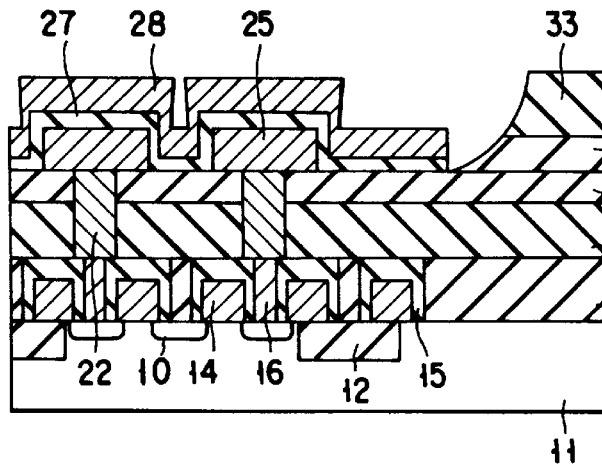
Figure 20B:
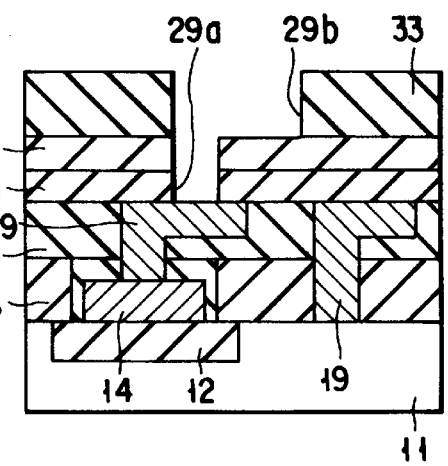

Next, a region having no capacitor is covered with a resist (not shown), and the insulating interlayers 32 and 33 in a region having capacitors are removed by, e.g., CDE or wet etching to expose an insulating interlayer 20. Consequently, a hole 26 is formed (FIGS. 18A and 18B).

The following steps in FIGS. 19A to 21A and 19B to 21B are substantially the same as the steps in FIGS. 8A to 10A and 8B to 10B of the first embodiment. That is, as shown in FIGS. 21A and 21B, a plate interconnection 30a which backs a capacitor upper electrode layer 28 is formed in the hole 26 in the region having the capacitors, and an interconnection 30b is formed in holes 29a and 29b in the region having no capacitor.

In the memory fabricated by the above process, functions and effects similar to those of the first embodiment can be obtained.

(Fourth Embodiment)

The fourth embodiment of the present invention will be described below in accordance with fabrication steps shown in FIGS. 22A to 25A and 22B to 25B. Note that the basic constituent elements are substantially the same as in the above first embodiment, and some fabrication steps are also the same as in the first embodiment. For these elements and steps, therefore reference is to be made to the corresponding drawings and explanations in the first embodiment unless otherwise specified, and a detailed description thereof will be omitted.

After FIGS. 5A and 5B in the first embodiment, a conductive film is deposited on the entire surface and patterned into a predetermined shape to form a capacitor lower electrode layer 25 (FIGS. 22A and 22B).

Subsequently, an insulating interlayer 34 is deposited on an insulating interlayer 20 and the capacitor lower electrode layer 25 such that the upper surface of this insulating interlayer 34 is higher than the upper surface of the capacitor lower electrode layer 25 (FIGS. 23A and 23B).

Next, a region having no capacitor is covered with a resist (not shown), and the insulating interlayer 34 in a region having capacitors is removed by, e.g., CDE or wet etching to expose the insulating interlayer 20. Consequently, a hole 26 is formed (FIGS. 24A and 24B).

The following steps are similar to the steps in FIGS. 8A to 10A and 8B to 10B of the first embodiment. That is, as shown in FIGS. 25A and 25B, a plate interconnection 30a which backs a capacitor upper electrode layer 28 is formed in the hole 26 in the region having the capacitors, and an interconnection 30b is formed in holes 29a and 29b in the region having no capacitor.

In the memory fabricated by the above process, functions and effects similar to those of the first embodiment can be obtained.

(Fifth Embodiment)

The fifth embodiment of the present invention will be described below in accordance with fabrication steps shown in FIGS. 26A to 30A and 26B to 30B. Note that the basic constituent elements are substantially the same as in the above first embodiment, and some fabrication steps are also the same as in the first embodiment. For these elements and steps, therefore, reference is to be made to the corresponding drawings and explanations in the first embodiment unless otherwise specified, and a detailed description thereof will be omitted.

As in the steps shown in FIGS. 3A to 7A and 3B to 7B of the first embodiment, a hole 26 is formed (FIGS. 26A and 26B). Note that the shape as shown in FIGS. 26A and 26B can also be formed by any of the methods used in the embodiments other than the first embodiment.

Next, an insulating film and a conductive film for forming a capacitor insulating film 27 and a capacitor upper electrode layer 28 are sequentially deposited (FIGS. 27A and 27B).

The capacitor upper electrode layer 28, the capacitor insulating film 27, and insulating interlayers 23 and 20 are selectively removed by RIE or the like to form contact holes 29a and interconnection trenches 29b and expose the surfaces of interconnections 19 (FIGS. 28A and 28B).

A conductive film 30 such as a W film is then deposited on the entire surface (FIGS. 29A and 29B).

Subsequently, planarization is performed by removing the conductive film 30, the capacitor upper electrode layer 28, and the capacitor insulating film by, e.g., etching back or CMP. Consequently, a plate interconnection 30a which backs the capacitor upper electrode layer 28 is formed in the hole 26 in a region having capacitors, and an interconnection 30b is formed in holes 29a and 29b in a region having no capacitor (FIGS. 30A and 30B)

In the memory fabricated by the above process, functions and effects similar to those of the first embodiment can be obtained.

(Sixth Embodiment)

The sixth embodiment of the present invention will be described below in accordance with fabrication steps shown in FIGS. 31A to 35A and 31B to 35B. Note that the basic constituent elements are substantially the same as in the above first embodiment, and some fabrication steps are also the same as in the first embodiment. For these elements and steps, therefore, reference is to be made to the corresponding drawings and explanations in the first embodiment unless otherwise specified, and a detailed description thereof will be omitted.

After FIGS. 5A and 5B in the first embodiment, a conductive film is deposited by sputtering on the entire surface and patterned into a predetermined shape to form a capacitor lower electrode layer 25 (FIGS. 31A and 31B).

Next, a capacitor insulating film 27 and a capacitor upper electrode layer 28 are sequentially deposited and patterned into a predetermined shape to form capacitors (FIGS. 32A and 32B).

Figure 33A:
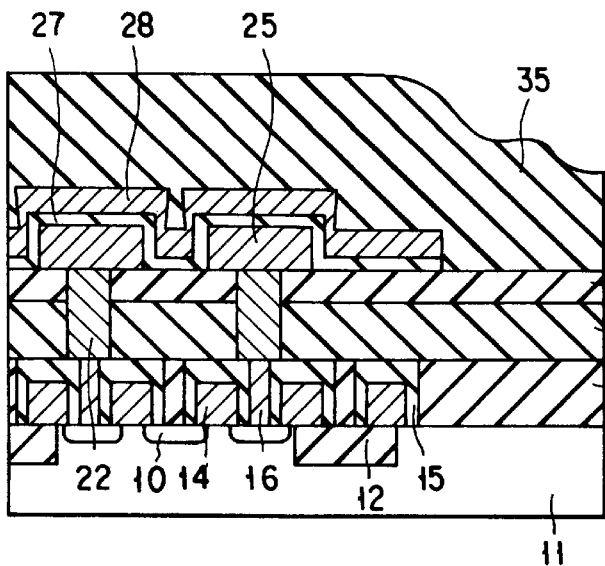
Figure 33B:
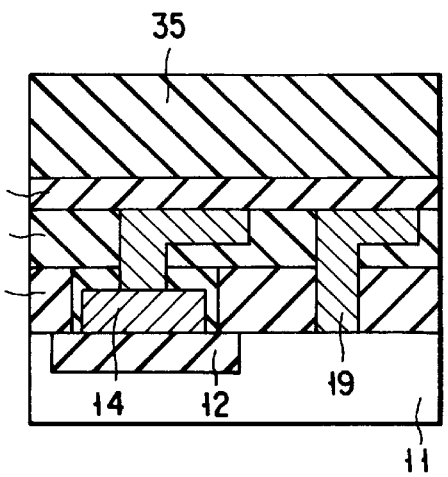

An insulating interlayer 35 is then deposited on an insulating interlayer 20 and the capacitors (FIGS. 33A and 33B).

Figure 34A:
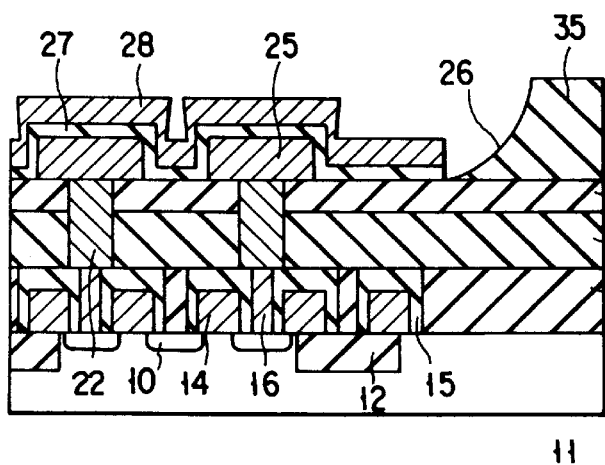
Figure 34B:
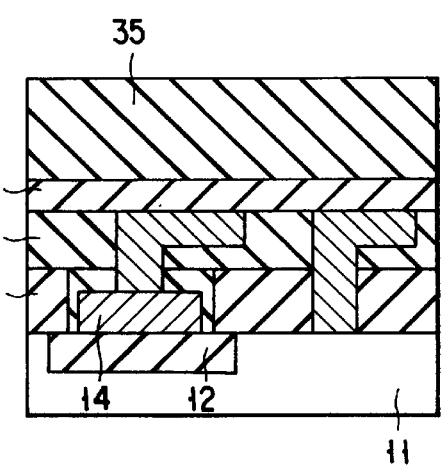

Next, a region having no capacitor is covered with a resist (not shown), and the insulating interlayer 35 in a region having the capacitors is removed by, e.g., CDE or wet etching to form a hole 26 (FIGS. 34A and 34B).

Figure 35A:
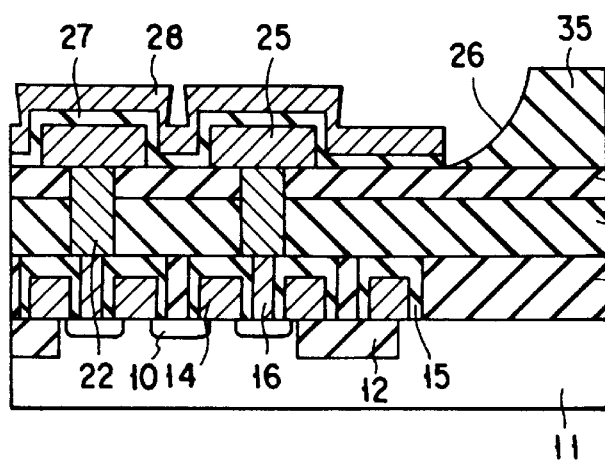
Figure 35B:
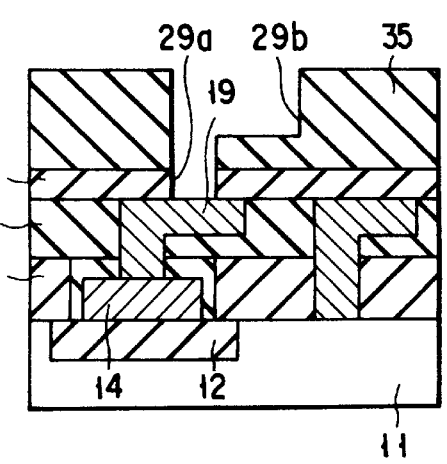

The insulating interlayers 35 and 20 are selectively removed by RIE or the like to form contact holes 29a and interconnection trenches 29b and expose the surfaces of interconnections 19 (FIGS. 35A and 35B).

Subsequently, a conductive film such as a W film is deposited on the entire surface and planarized by, e.g., etching or CMP. Consequently, a plate interconnection 30a which backs the capacitor upper electrode layer 28 is formed in the hole 26 in the region having the capacitors, and an interconnection 30b is formed in the holes 29a and 29b in the region having no capacitor (FIGS. 36A and 36B).

In the memory fabricated by the above process, functions and effects similar to those of the first embodiment can be obtained.

(Seventh Embodiment)

The seventh embodiment of the present invention will be described in detail below with reference to FIGS. 37A, 37B, 37C to 46A, and 46B.

First, element isolation regions 102 are formed by STI (Shallow Trench Isolation) in a semiconductor substrate 101 using silicon, and p-type well regions are formed by ion implantation of an impurity (FIGS. 37A to 37C).

To form transistors, a 6-nm thick gate oxide film (not shown) is formed on the semiconductor substrate 101, a polysilicon film 103a about 50 nm thick, a tungsten silicide (WSi) or tungsten (W) film 103b about 100 nm thick, and a silicon nitride (SiN) film 103c about 100 nm thick are deposited as gate electrodes 103. After the gate electrodes 103 are patterned, an n-type impurity such as P or As is ion-implanted to form a source/drain diffusion layer 104. Subsequently, a 30-nm thick silicon nitride film 105 is deposited and etched back to form a side-wall insulating film on the gate electrodes 103. After transistors are formed, an insulating film 106 (e.g., BPSG or plasma $SiO_2$) about 250 to 300 nm thick is deposited by CVD on the entire surface (FIGS. 38A to 38C).

Figures 39A, 39B:
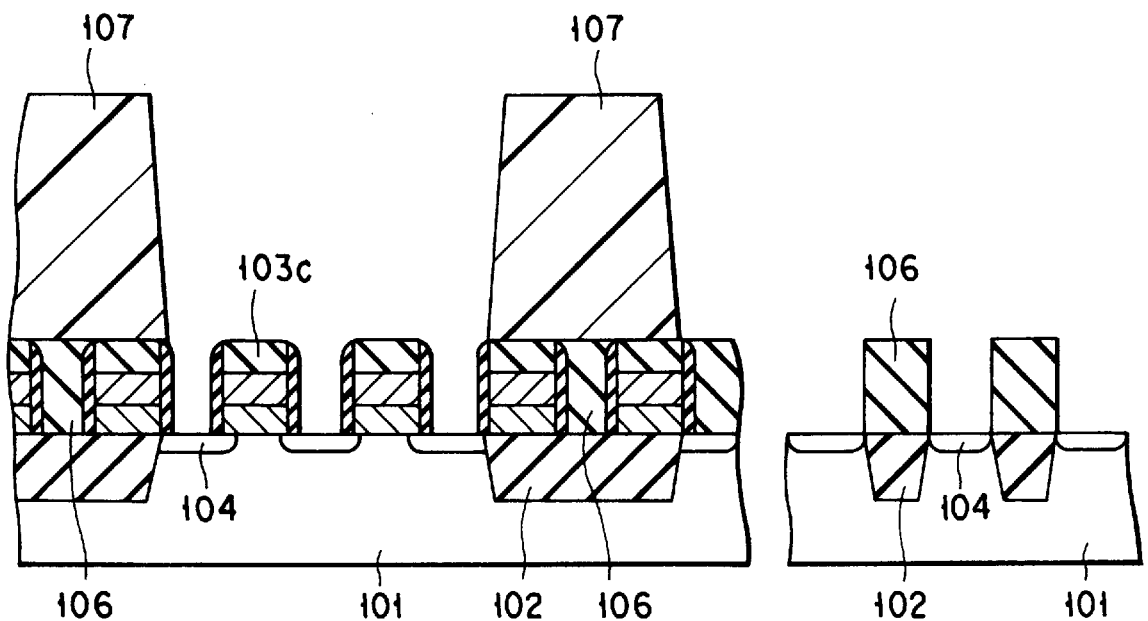
FIGS. 39A to 39C are views showing the step following FIGS. 38A to 38C.
Figure 39C:
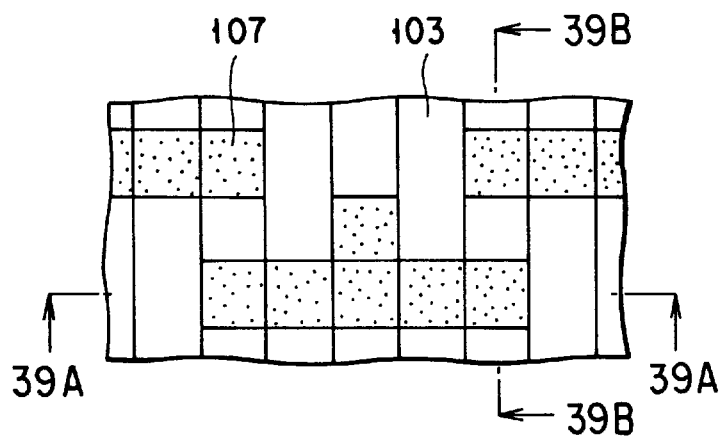

Next, the insulating film 106 is planarized by CMP (Chemical Mechanical Polishing) by using the SiN film 103c as a stopper and patterned by using a resist mask 107 (opening pattern) to form contact holes self-aligned with the gate electrodes 103 (FIGS. 39A to 39C).

The resist is then removed, and a conductive film 108 for forming plugs, e.g., a P- or As-doped poly-Si film is deposited by CVD on the entire surface (FIGS. 40A and 40B).

This conductive film 108 for forming plugs is planarized by CMP by using the SiN film 103c as a stopper. Subsequently, an insulating film 109 (e.g., PBSG or plasma $SiO_2$) about 100 to 200 nm thick is deposited by CVD on the entire surface and planarized by CMP to form bit line contacts 110 reaching the plugs 108 previously formed. A conductive film 111a composed of Ti/TiN about 20 nm thick and W about 100 nm thick is deposited by CVD on the insulating film 109, an SiN film 111b about 150 nm thick is deposited on the conductive film 111a, and these films are patterned to form bit lines 111. In addition, an SiN film 112 about 30 nm thick is deposited and etched to form a side-wall insulating film 112 on the side walls of the bit lines (FIGS. 41A to 41C).

Next, an insulating film 113 (e.g., BPSG or plasma $SiO_2$) about 400 nm thick is so deposited as to cover the bit lines 111 and planarized by CMP. This insulating film 113 is etched to be self-aligned with the bit lines 111 by using a resist mask, thereby forming contact holes reaching the plugs 108 previously formed. After the resist is removed, these contact holes are buried with a conductive material, e.g., a barrier metal (Ti/TiN) and W or heavily doped poly-Si and planarized to form storage node contacts 114 (FIGS. 41A to 41C).

Figure 42A:
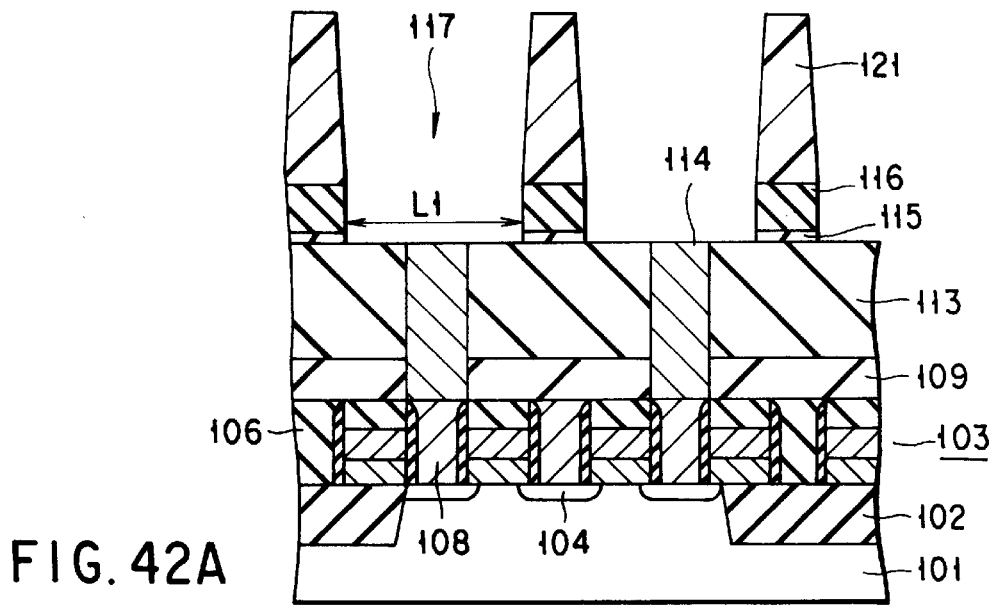
FIGS. 42A to 42C are views showing the step following FIGS. 41A to 41C.
Figure 42B:
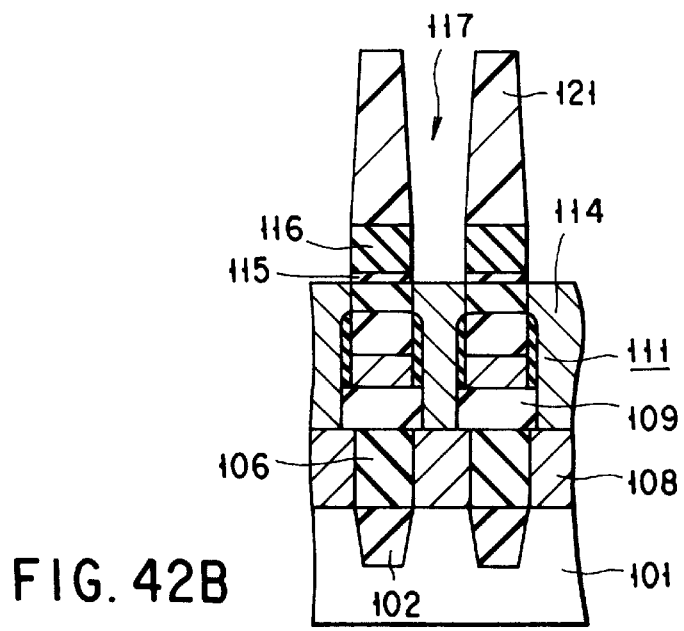
Figure 42C:
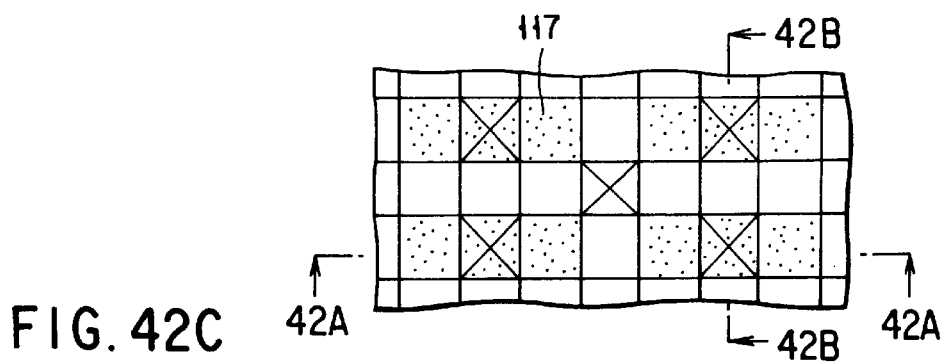

A film having high selectivity to an oxide film, e.g., a 50-nm thick SiN film 115 is evenly deposited on the entire surface, and subsequently an insulating film 116 (e.g., BPSG or plasma $SiO_2$) about 300 nm thick is deposited on the entire surface. The insulating film 116 and the SiN film 115 are etched by RIE by using a resist mask 121 having an opening pattern to form trenches 117 (FIGS. 42A to 42C).

A storage node electrode material 118, e.g., 20-nm thick tungsten nitride (W/N), ruthenium (Ru), or ruthenium oxide ($RuO_x$) is deposited to bury the trenches 117 (FIGS. 43A and 43B).

This storage node electrode material 118 is planarized by CMP down to the upper surface of the insulating film 116, forming storage node electrodes. Ruthenium or a ruthenium compound used as the storage node electrodes 118 is suited to the electrode of a capacitor using a high-dielectric film such as barium strontium titanate (BSTO), but the material is difficult to etch by using RIE. In this embodiment, therefore, ruthenium or the like is buried in the trenches to facilitate the formation of the storage node electrodes 118 (FIGS. 44A and 44B).

The insulating film 116 is then completely removed by wet etching to expose the side surfaces of the storage node electrodes 118. Since the SiN film 115 functions as a stopper for this wet etching, the insulating film 113 is not etched. The SiN film 115 exposed by the etching evenly and selectively covers a region where the storage node electrodes 118 are not formed. That is, the SiN film 115 is not formed in a region of the side surfaces of the storage node electrodes 118 higher than the film thickness of the SiN film 115 and on the upper surfaces of the storage node electrodes 118 (FIGS. 45A and 45B).

As a capacitor dielectric film 119, barium strontium titanate (BSTO) or the like is deposited by CVD or sputtering. Subsequently, as a plate electrode 120, a tungsten nitride film, ruthenium film, or ruthenium oxide film about 100-nm thick is deposited and planarized by CMP to form capacitors (FIGS. 46A and 46B).

Thereafter, interconnections and the like are formed by using conventional methods to complete a DRAM.

Figure 47:
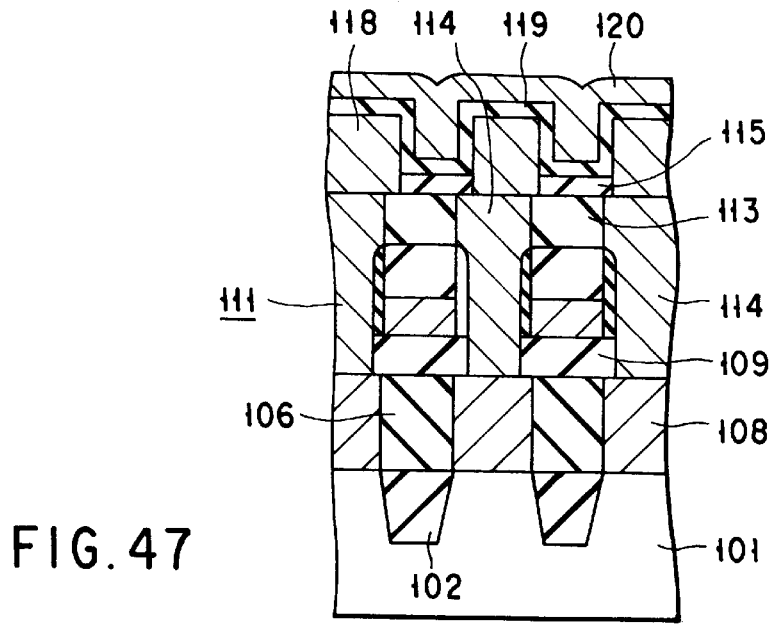
FIG. 47 is a sectional view showing the state in which a pattern is misaligned in FIG. 46B.

FIG. 47 shows the state in which the storage node contacts 114 and the storage node electrodes 118 are misaligned. In this embodiment, the stopper film 115 is formed below the capacitor dielectric film 119. Therefore, even if such misalignment occurs, deterioration of the capacitor characteristics or the like can be prevented.

(Eighth Embodiment)

The eighth embodiment of the present invention will be described in detail below with reference to FIGS. 48 to 52.

In this eighth embodiment, some fabrication steps in the seventh embodiment shown in FIGS. 37A to 46B are changed. Therefore, only steps requiring an explanation will be described below, and reference is to be made to the corresponding explanations and drawings in the seventh embodiment for the rest.

Since steps in the first half are the same as the steps (FIGS. 37A to 41C) in the seventh embodiment, subsequent steps will be described. Note that steps shown in FIGS. 48 to 52 substantially correspond to the steps shown in FIGS. 24A to 46B in the seventh embodiment.

Figure 48:
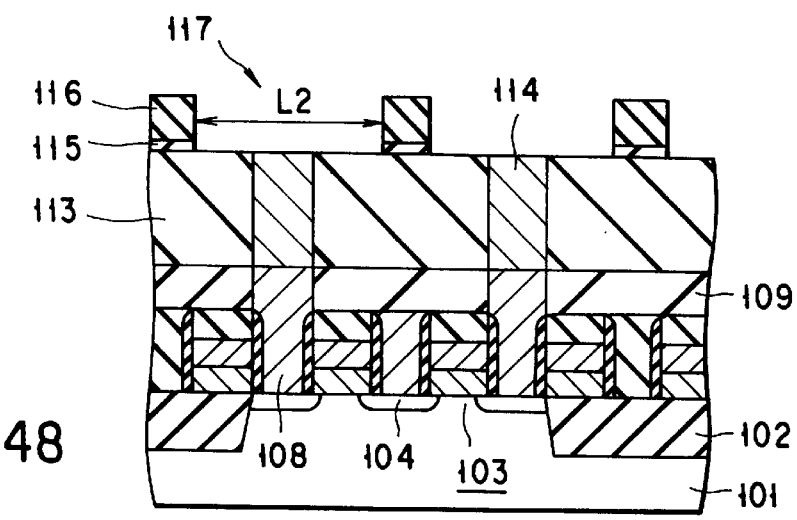
FIGS. 48 to 52 are sectional views showing fabrication steps according to the eighth embodiment of the present invention in order of steps.

After the steps in FIGS. 41A to 41C, a film having high selectivity to an oxide film, e.g., a 50-nm thick SiN film 115 is evenly deposited on the entire surface, and subsequently an insulating film 116 (e.g., BPSG or plasma $SiO_2$) about 300 nm thick is deposited on the entire surface. The insulating film 116 is anisotropically etched in the longitudinal direction by RIE by using a resist mask having an opening pattern to form trenches 117. In this etching the SiN film 115 functions as a stopper for the etching. Subsequently, wet etching is performed by using the SiN film 115 as a stopper to isotropically etch the insulating film 116 by about 20 nm in the lateral direction. The insulating film 116 thus patterned is then used to etch away the SiN film 115 left behind on the bottoms of the trenches by using RIE. This isotropic etching of the insulating film 116 increases the width of the trenches 117 (a width L2 is larger than a width L1 in the seventh embodiment (FIGS. 42A to 42C)) and thereby increases the bottom area of a capacitor (FIG. 48).

Figure 49:
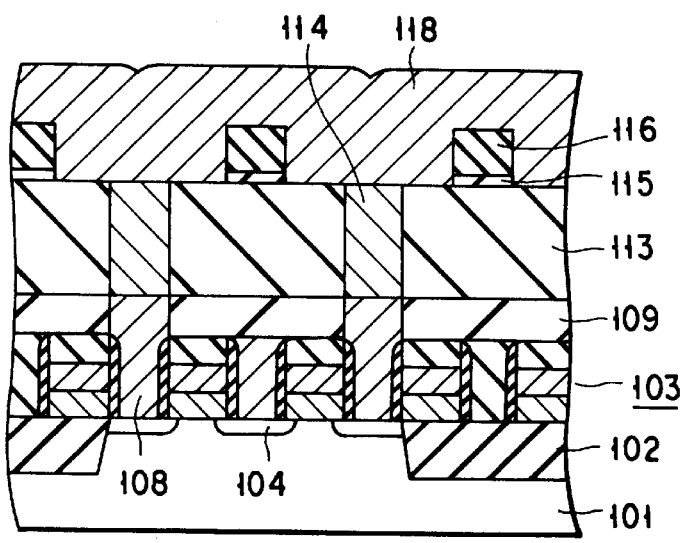

Next, a storage node electrode material 118, e.g., 200-nm thick tungsten nitride (W/N), ruthenium (Ru), or ruthenium oxide ($RuO_x$) is deposited by sputtering to bury the trenches 117 (FIG. 49).

Figure 50:
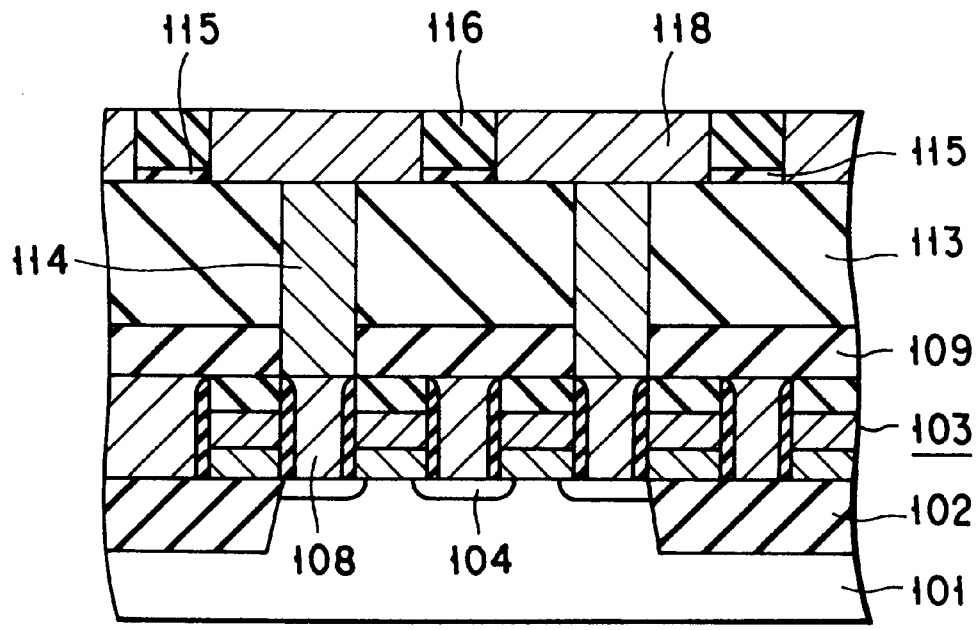

This storage node electrode material 118 is planarized by CMP down to the upper surface of the insulating film 116, forming storage node electrodes (FIG. 50).

Figure 51:
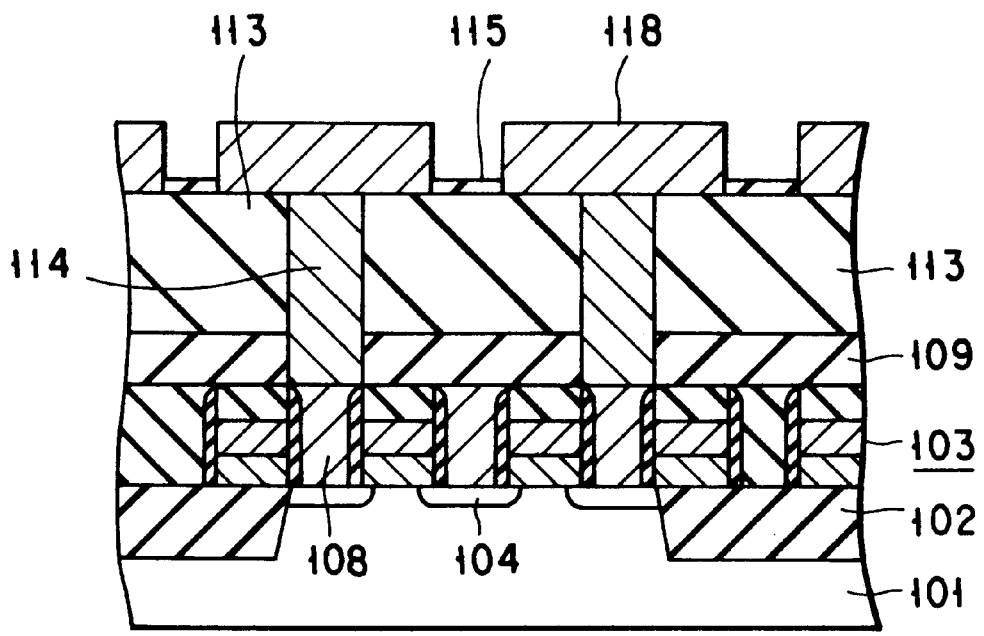

The insulating film 116 is then completely removed by wet etching to expose the side surfaces of the storage node electrodes 118. Since the SiN film 115 functions as a stopper for this wet etching, an insulating film 113 is not etched. The SiN film 115 exposed by the etching evenly and selectively covers a region where the storage node electrodes 118 are not formed (FIG. 51).

Figure 52:
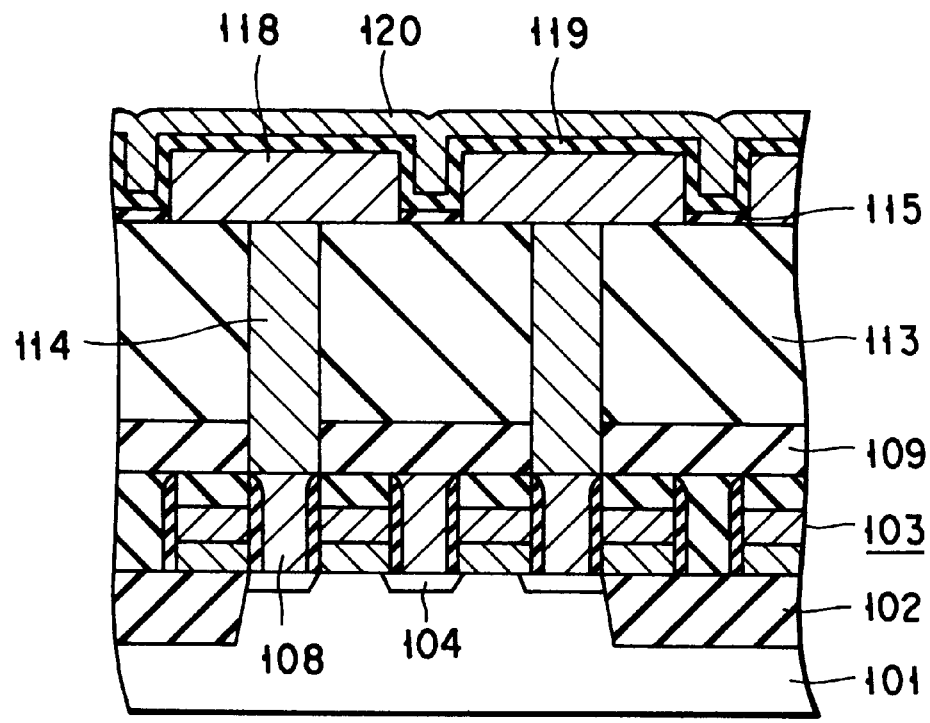

As a capacitor dielectric film 119, barium strontium titanate (BSTO) or the like is deposited by CVD or sputtering. Subsequently, as a plate electrode 120, a tungsten nitride film, ruthenium film, or ruthenium oxide film about 100-nm thick is deposited and planarized by CMP to form capacitors (FIG. 52).

Thereafter, interconnections and the like are formed by using conventional methods to complete a DRAM.

In this eighth embodiment, effects similar to those in the seventh embodiment can be obtained. Additionally, since the bottom area of the trench can be increased, the capacitance of the capacitor can also be increased.

In the semiconductor memory according to the present invention, the resistance can be decreased, and planarization can also be achieved because the heights of the multilayered interconnecting layer can be made almost equal to each other in the region where the first holes are formed and the region where the second holes are formed.

In the method of fabricating the semiconductor memory according to the present invention, the first and second holes are simultaneously buried with the multilayered interconnecting layer. Therefore, the resistance can be decreased without increasing the number of fabrication steps. At the same time, planarization can be achieved because the heights of the multilayered interconnecting layer can be made almost equal to each other in the region where the first holes are formed and the region where the second holes are formed. This increases the process margin in lithography.

Also, in the semiconductor memory according to the present invention, even if the storage node contact and the storage node electrode are misaligned, deterioration of the insulating properties or the like resulting from a capacitor formed in this misaligned region can be prevented because in this misaligned region the stopper insulating film in the etching step is formed in addition to the capacitor insulating film. Consequently, deterioration of the performance of the whole capacitor can be prevented.

Furthermore, in the method of fabricating the semiconductor memory according to the present invention, even if the storage node contact and the storage node electrode are misaligned, deterioration of the insulating properties or the like resulting from a capacitor formed in this misaligned region can be prevented. At the same time, since the storage node electrode is buried in the trenches, the area of this storage node electrode buried in the trenches can be increased by widening the trenches by isotropic etching. Consequently, the area of the capacitor and therefore the capacitance of the capacitor can be increased.

Furthermore, in the method of the present invention, side surfaces of the storage node electrode are aligned with the trench formed in $SiO_2$ film by RIE. The upper surface of the storage node electrode is defined by planarization (for example, CMP), so that the upper surface is made flatter compared with a case where a metal storage node electrode is formed by etching. Therefore, the reliability of the capacitor insulating film in this invention will be increased.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:

a semiconductor substrate;

a memory cell portion formed on said semiconductor substrate and comprising a plurality of stacked capacitors formed on said semiconductor substrate, each of said stacked capacitors having a storage electrode formed on a bottom surface of a recess in an insulating layer, a capacitor insulating film formed on said storage electrode, and a plate electrode formed on said capacitor insulating film and lower than an upper edge of said recess, and a plate interconnecting layer connected to said plate electrode; and a peripheral circuit portion formed adjacent to said memory cell portion on said semiconductor substrate and comprising an interconnecting layer, wherein said interconnecting layer has an upper surface substantially leveled with an upper surface of said plate interconnecting layer.

2. A memory according to claim 1, wherein an upper surface of said plate electrode of said capacitor is formed to be lower than the upper surface of said plate interconnecting layer.

3. A memory according to claim 1, further comprising:

a multilayered interlayer insulating film on said semiconductor substrate; and a bit line included in said multilayered interlayer insulating film, wherein said bit line is formed in a position lower than said storage electrode.

4. A memory according to claim 1, wherein said plate interconnecting layer includes a portion so formed as to bury said recess and connected to said plate electrode.

5. A memory according to claim 1, wherein said plate interconnecting layer and said interconnecting layer are formed of the same material.

6. A semiconductor memory comprising:

a semiconductor substrate;

a memory cell portion formed on said semiconductor substrate and comprising a plurality of stacked capacitors formed on said semiconductor substrate, each of said stacked capacitors having a storage electrode formed on a bottom surface of a recess in an insulating layer, a capacitor insulating film formed on said storage electrode, and a plate electrode formed on said capacitor insulating film and lower than an upper edge of said recess, and a plate interconnecting layer connected to said plate electrode; and a peripheral circuit portion formed adjacent to said memory cell portion on said semiconductor substrate and comprising an interconnecting layer, wherein said plate interconnecting layer and said interconnecting layer are formed of the same material, and an upper surface of said plate interconnecting layer is substantially leveled with an upper surface of said interconnecting layer.

7. A memory according to claim 6, wherein an upper surface of said plate electrode of said capacitor is formed to be lower than an upper surface of said plate interconnecting layer.

8. A memory according to claim 6, further comprising:

a multilayered interlayer insulating film on said semiconductor substrate; and a bit line included in said multilayered interlayer insulating film, wherein said bit line is formed in a position lower than said storage electrode.

9. A memory according to claim 6, wherein said plate interconnecting layer includes a portion so formed as to bury said recess and connected to said plate electrode.

10. A semiconductor memory comprising:

a semiconductor substrate;

a transistor formed in said semiconductor substrate and having an gate and source/drain regions;

a first, a second and a third insulating layer stacked in order, said third insulating layer having a recess on a surface thereof;

a first contact plug formed in said first insulating layer and connected to one of said source/drain regions of said transistor;

a bit line formed on said first insulating layer and connected to said one of said source/drain regions of said transistor through said first contact plug;

a second contact plug formed in said first insulating layer and connected to the other of said source/drain regions of said transistor;

a third contact plug formed in said second insulating layer and connected to said second contact plug;

a capacitor formed on said second insulating layer, said capacitor having a storage electrode, a capacitor insulating film and a plate electrode, said storage electrode being electrically connected to the other of said source/drain regions of said transistor through said third and said second contact plug;

a plate interconnecting layer formed on said plate electrode; and an interconnecting layer formed in a peripheral circuit region, wherein said plate interconnecting layer and said interconnecting layer are formed of the same material, and an upper surface of said plate interconnecting layer is substantially leveled with an upper surface of said interconnecting layer.

11. A memory according to claim 10, wherein an upper surface of said plate electrode of said capacitor is formed to be lower than an upper surface of said plate interconnecting layer.

12. A memory according to claim 10, further comprising:

a multilayered interlayer insulating film on said semiconductor substrate; and a bit line included in said multilayered interlayer insulating film, wherein said bit line is formed in a position lower than said storage electrode.

13. A memory according to claim 10, wherein said plate interconnecting layer includes a portion so formed as to bury said recess and connected to said plate electrode.

* * * * *